(12) United States Patent
Matsubara et al.

(10) Patent No.: US 10,804,882 B2
(45) Date of Patent: Oct. 13, 2020

(54) MULTIPLEXER, HIGH-FREQUENCY FRONT END CIRCUIT, AND COMMUNICATION DEVICE

(71) Applicant: Murata Manufacturing Co., Ltd., Nagaokakyo-shi, Kyoto-fu (JP)

(72) Inventors: Hiroshi Matsubara, Nagaokakyo (JP); Masanori Kato, Nagaokakyo (JP); Syunsuke Kido, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/574,249

(22) Filed: Sep. 18, 2019

(65) Prior Publication Data

US 2020/0014370 A1  Jan. 9, 2020

Related U.S. Application Data

(63) Continuation of application No. PCT/JP2018/010643, filed on Mar. 16, 2018.

(30) Foreign Application Priority Data

Mar. 31, 2017  (JP) ................. 2017-072760

(51) Int. Cl.
*H03F 3/191* (2006.01)
*H03H 9/70* (2006.01)
(Continued)

(52) U.S. Cl.
CPC ............... *H03H 9/70* (2013.01); *H03F 3/195* (2013.01); *H03H 7/38* (2013.01); *H03H 9/542* (2013.01);
(Continued)

(58) Field of Classification Search
CPC ..................................................... H03F 3/191
(Continued)

(56) References Cited

U.S. PATENT DOCUMENTS 9,641,149 B2 * 5/2017 Kim ..................... H03H 7/38
2003/0214368 A1 * 11/2003 Taniguchi .............. H03H 9/725
                                                        333/133

(Continued)

FOREIGN PATENT DOCUMENTS

JP      05-55863 A     3/1993
JP      10-65489 A     3/1998
(Continued)

OTHER PUBLICATIONS

Official Communication issued in International Patent Application No. PCT/JP2018/010643, dated May 15, 2018.

*Primary Examiner* — Henry Choe
(74) *Attorney, Agent, or Firm* — Keating & Bennett, LLP

(57) ABSTRACT

A hybrid multiplexer includes a filter configured to allow a high-frequency signal of an HB to pass therethrough, and a filter configured to allow a high-frequency signal of an MB to pass therethrough, in which the filter includes a matching circuit, a first resonance circuit defined by one of an LPF and an HPF, and a second resonance circuit defined by the other of the LPF and the HPF, the LPF includes an inductor and a parallel arm resonator, the HPF includes a serial arm resonator and an inductor, and a resonant frequency of the parallel arm resonator and an anti-resonant frequency of the serial arm resonator are both located between a frequency at a low-band end of the HB and a frequency at a high-band end of the HB.

18 Claims, 12 Drawing Sheets

(51) Int. Cl.
*H03F 3/195* (2006.01)
*H03H 7/38* (2006.01)
*H03H 9/54* (2006.01)
*H03H 9/60* (2006.01)
*H04B 1/52* (2015.01)

(52) U.S. Cl.
CPC ....... *H03H 9/605* (2013.01); *H03F 2200/294* (2013.01); *H03F 2200/451* (2013.01); *H04B 1/52* (2013.01)

(58) Field of Classification Search
USPC .................................................. 330/302, 305
See application file for complete search history.

(56) References Cited

U.S. PATENT DOCUMENTS

| | | | |
|---|---|---|---|
| 2012/0112850 A1* | 5/2012 | Kim | .................... H03H 7/38 333/32 |
| 2014/0368401 A1 | 12/2014 | Miyake et al. | |
| 2016/0126994 A1 | 5/2016 | Domino et al. | |
| 2016/0197643 A1 | 7/2016 | Uejima | |
| 2017/0094662 A1 | 3/2017 | Ebihara et al. | |

FOREIGN PATENT DOCUMENTS

| | | |
|---|---|---|
| JP | 2003-332885 A | 11/2003 |
| JP | 2006-128881 A | 5/2006 |
| JP | 2014-033377 A | 2/2014 |
| JP | 2016-092828 A | 5/2016 |
| JP | 2017-063315 A | 3/2017 |
| WO | 2007/023643 A1 | 3/2007 |
| WO | 2013/150814 A1 | 10/2013 |
| WO | 2015/041125 A1 | 3/2015 |

\* cited by examiner

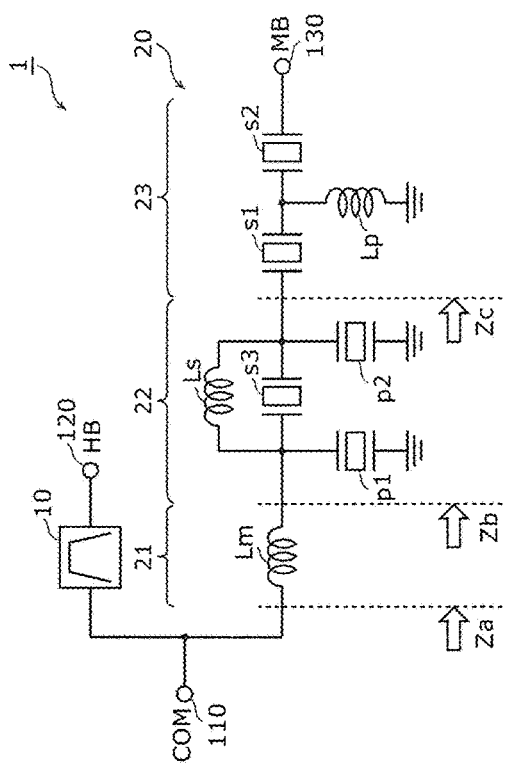
FIG. 8A
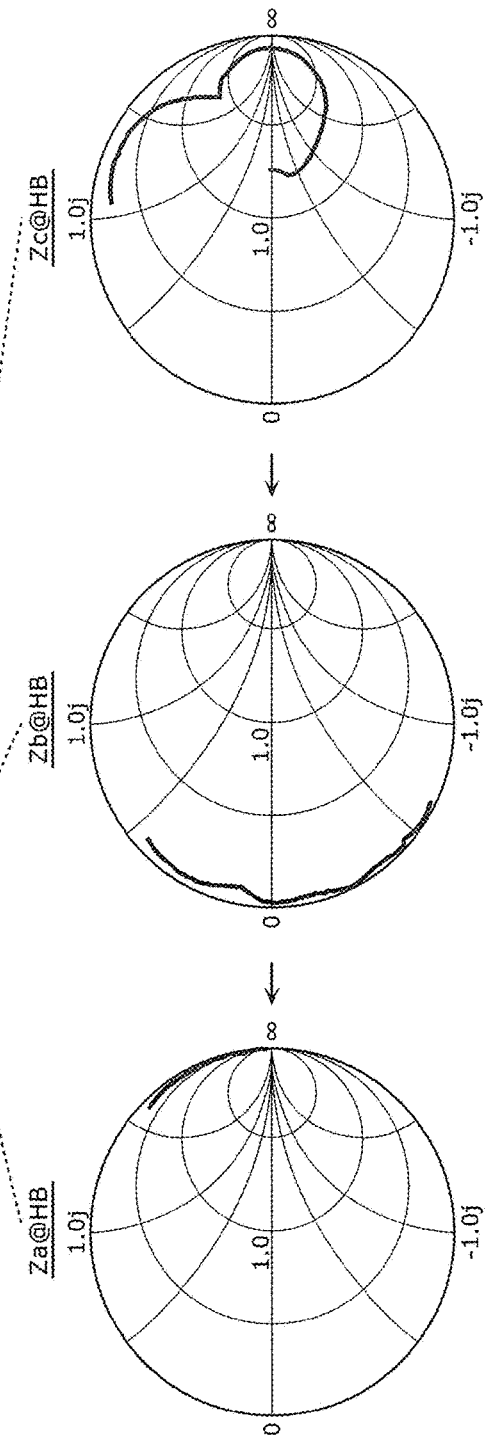
FIG. 8B
FIG. 8C
FIG. 8D

MULTIPLEXER, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2017-072760 filed on Mar. 31, 2017 and is a Continuation Application of PCT Application No. PCT/JP2018/010643 filed on Mar. 16, 2018. The entire contents of each application are hereby incorporated herein by reference.

BACKGROUND OF THE INVENTION

1. Field of the Invention

The present invention relates to a multiplexer, and a high-frequency front end circuit including the same, and a communication device.

2. Description of the Related Art

As a multiplexer in which one terminal of each of a plurality of filters is commonly connected, an existing diplexer configured of a high pass filter which is an LC filter including an LC parallel resonance circuit and a low pass filter which is an LC filter including an LC parallel resonance circuit has been disclosed (see, for example, Japanese Unexamined Patent Application Publication No. 2006-128881).

Here, the multi-band capable communication device communicates by selectively or simultaneously using a plurality of high-frequency signals having different frequency bands from one another. In this regard, in recent years, the frequency bands respectively allocated to the plurality of high-frequency signals tend to be close to one another in accordance with further demand for multi-band. For this reason, it is required for the multiplexer to demultiplex or multiplex the high-frequency signals whose frequency bands are close to one another. That is, each of a plurality of filters of the multiplexer is required to suppress insertion loss in a wide pass band and to secure high attenuation in a frequency band close thereto.

However, since steep attenuation characteristics cannot be obtained in the LC filter, there is a problem in that it is difficult to demultiplex or multiplex the high-frequency signal whose frequency band is close to another high-frequency signal in the existing multiplexer using this filter.

In addition, in order to cope with demultiplexing or multiplexing of the high-frequency signal whose frequency band is close to the other high-frequency signal, a multiplexer using an acoustic wave filter by which the steep attenuation characteristics can be obtained is considered. However, in the acoustic wave filter, it is difficult to obtain a flat bandpass characteristic in which the insertion loss is suppressed over a wide band. For this reason, the multiplexer using the acoustic wave filter has another problem in that it is difficult to demultiplex or multiplex a high-frequency signal of a wide frequency band.

SUMMARY OF THE INVENTION

Preferred embodiments of the present invention provide multiplexers, high-frequency front end circuits, and communication devices that are each capable of demultiplexing or multiplexing a high-frequency signal whose frequency band is wide and close to another high-frequency signal.

A multiplexer according to a preferred embodiment of the present invention includes a common terminal; a first filter connected to the common terminal and configured to allow passing of a first frequency band; a second filter connected to the common terminal and configured to allow passing of a second frequency band which does not overlap with the first frequency band, in which the second filter includes a matching circuit connected to the common terminal, a first resonance circuit which is cascade connected to the matching circuit and defined by one of a low pass filter and a high pass filter, and a second resonance circuit which is cascade connected to the first resonance circuit and defined by another of the low pass filter and the high pass filter, the low pass filter includes a first inductor provided on a signal path connecting a first terminal and a second terminal of the second filter, and a first parallel arm resonator which is an acoustic wave resonator connected between a node on the signal path and a ground, the high pass filter includes a first serial arm resonator which is an acoustic wave resonator provided on the signal path, and a second inductor connected between a node on the signal path and the ground, and a resonant frequency of the first parallel arm resonator and an anti-resonant frequency of the first serial arm resonator are both located between a frequency at a low-band end of the first frequency band and a frequency at a high-band end of the first frequency band.

As described above, each of the first parallel arm resonator and the first serial arm resonator is an acoustic wave resonator, and the resonant frequency of the first parallel arm resonator and the anti-resonant frequency of the first serial arm resonator are located between the frequency at the low-band end of the first frequency band and the frequency at the high-band end of the first frequency band. Here, the acoustic wave resonator defines and functions as a resonator having a high Q value between the resonant frequency and the anti-resonant frequency and in the vicinity thereof, and defines and functions as a capacitor on a sufficiently lower-band side than the resonant frequency and a sufficiently higher-band side than the anti-resonant frequency.

Accordingly, the second filter has an attenuation pole group defined by the resonant frequency of the first parallel arm resonator and the anti-resonant frequency of the first serial arm resonator in the frequency band between the frequency at the low-band end of the first frequency band and the frequency at the high-band end of the first frequency band. The attenuation characteristics provided by this attenuation pole group have steepness and an attenuation defined by the acoustic wave resonator, and therefore have high steepness and a sufficient attenuation. Additionally, the second filter has characteristics of an LC resonance circuit defined by each of the first parallel arm resonator and the first serial arm resonator defining and functioning as a capacitor outside the above-described frequency band, and specifically has a bandpass characteristic in which loss is reduced or prevented over a wide band.

That is, the second filter has a bandpass characteristic in which the loss is reduced or prevented over a wide band outside the pass band of the first filter and steep attenuation occurs in the pass band of the first filter. For this reason, the multiplexer according to the present preferred embodiment is able to demultiplex or multiplex a high-frequency signal whose frequency band is wide and close to another high-frequency signal.

Additionally, according to the present preferred embodiment, in the second filter, the matching circuit, the low pass filter, and the high pass filter are cascade connected. With this configuration, by appropriately adjusting a configuration of the matching circuit and a connection order between the low pass filter and the high pass filter in accordance with a relative relationship between the frequency bands of the first frequency band and the second frequency band, it is possible to provide impedance in the first frequency band when the second filter is viewed from the common terminal side high impedance.

Accordingly, leakage of the high-frequency signal passing through the first filter to the second filter side is able to be reduced or prevented, and thus, demultiplexing characteristics or multiplexing characteristics are improved.

Furthermore, the frequency at the low-band end of the first frequency band may be located at a higher-band side than a frequency at a high-band end of the second frequency band, the matching circuit may be defined by a matching inductor provided in series on the signal path, the first resonance circuit may be the low pass filter, and the second resonance circuit may be the high pass filter.

With this configuration, a circuit of the second filter on a side closest to the first filter includes the matching circuit and the first resonance circuit and exhibits low pass characteristics. Accordingly, since a reflection coefficient in the first frequency band when the second filter is viewed from the common terminal side is able to be brought close to one over a wide band, the demultiplexing characteristics or the multiplexing characteristics are improved.

Additionally, by appropriately adjusting an inductance value of the matching inductor, the impedance in the first frequency band when the second filter is viewed from a common connection point between the first filter and the second filter is able to be made open over a wide band, and thus loss in the pass band of the first filter is able to be reduced or prevented.

Furthermore, a capacitor connected in parallel to the matching inductor may be further included, a resonant frequency of a parallel circuit of the matching inductor and the capacitor may be located in a frequency band obtained by multiplying the second frequency band by an integer equal to or more than two.

With this configuration, an attenuation pole defined by the parallel circuit of the matching inductor and the capacitor is located in the frequency band of a harmonic wave of a high-frequency signal passing through the second filter. Therefore, it is possible to reduce or prevent harmonic wave distortion of the second filter from occurring.

Furthermore, the frequency at the high-band end of the first frequency band may be located at a lower-band side than a frequency at a low-band end of the second frequency band, the matching circuit may include a matching inductor connected between a node on the signal path and the ground, the first resonance circuit may be the high pass filter, and the second resonance circuit may be the low pass filter.

By the matching circuit including the matching inductor connected between the node on the signal path and the ground in this manner, a circuit of the second filter on a side closest to the first filter includes the matching circuit and the first resonance circuit and exhibits high pass characteristics. Here, the frequency at the high-band end of the first frequency band is located on the lower-band side than the frequency at the low-band end of the second frequency band. Accordingly, since the reflection coefficient in the first frequency band when the second filter is viewed from the common terminal side is able to be brought close to one over a wide band, the demultiplexing characteristics or the multiplexing characteristics are improved.

Additionally, by appropriately adjusting the inductance value of the matching inductor, the impedance in the first frequency band when the second filter is viewed from the common connection point between the first filter and the second filter is able to be made open over a wide band, and thus the loss in the pass band of the first filter is able to be reduced or prevented.

Furthermore, a circuit in which the matching circuit and the first resonance circuit are cascade connected may exhibit low pass characteristics when the frequency at the low-band end of the first frequency band is located at the higher-band side than the frequency at the high-band end of the second frequency band, and may exhibit high pass characteristics when the frequency at the high-band end of the first frequency band is located at the lower-band side than the frequency at the low-band end of the second frequency band.

With this configuration, since a reflection coefficient in the first frequency band when the second filter is viewed from the first filter is able to be brought close to one over a wide band, the demultiplexing characteristics or the multiplexing characteristics are improved.

Furthermore, the resonant frequency of the first parallel arm resonator may be located at a higher-band side than the anti-resonant frequency of the first serial arm resonator.

With this configuration, the impedance in the first frequency band when the second filter is viewed from the common connection point between the first filter and the second filter is able to be made open over a wide band. Accordingly, it is possible to reduce or prevent the loss in the pass band of the first filter.

Furthermore, the low pass filter may further include a bridging resonator which is an acoustic wave resonator bridge-connected to the first inductor, and a sub-anti-resonant frequency which is different from the anti-resonant frequency of the bridging resonator in a circuit in which the first inductor and the bridging resonator are bridge-connected may be located between the frequency at the low-band end of the first frequency band and the frequency at the high-band end of the first frequency band.

With this configuration, in the second filter, since the number of attenuation poles to be provided is increased, it is possible to widen a frequency band in which sufficient attenuation is able to be secured. Accordingly, it is possible to demultiplex or multiplex wide-band high-frequency signals whose frequency bands are close to each other.

Furthermore, the sub-anti-resonant frequency may be located between an anti-resonant frequency group of one or more serial arm resonators of the high pass filter and a resonant frequency group of one or more parallel arm resonators of the low pass filter.

This makes it possible to widen a frequency difference between the anti-resonant frequency of the first serial arm resonator and the resonant frequency of the first parallel arm resonator, and thus in the second filter, the frequency band in which the attenuation is secured by the attenuation pole group is able to be widened. That is, since the second filter capable of obtaining attenuation characteristics in a wider band is able to be provided, the wide-band high-frequency signals are able to be demultiplexed or multiplexed.

Furthermore, the low pass filter may further include a second parallel arm resonator which is an acoustic wave resonator connected between a node on the signal path and the ground, the high pass filter may further include a second serial arm resonator which is an acoustic wave resonator provided on the signal path, of the first parallel arm resonator and the second parallel arm resonator, one may be connected to the node on one terminal side of the first inductor and another may be connected to the node on another terminal side of the first inductor, a resonant frequency of the second parallel arm resonator may be located on a higher-band side than both the anti-resonant frequency of the first serial arm resonator and an anti-resonant frequency of the second serial arm resonator and on a lower-band side than the frequency at the high-band end of the first frequency band, the first serial arm resonator and the second serial arm resonator may be connected to each other with a node, to which the second inductor is connected, on the signal path interposed between the first serial arm resonator and the second serial arm resonator, and the anti-resonant frequency of the second serial arm resonator may be located on a higher-band side than the frequency at the low-band end of the first frequency band and on a lower-band side than both the resonant frequency of the first parallel arm resonator and the resonant frequency of the second parallel arm resonator.

With this configuration, in the second filter, since the number of attenuation poles to be provided is increased, it is possible to widen a frequency band in which sufficient attenuation is able to be secured. Additionally, the impedance in the first frequency band when the second filter is viewed from the common connection point between the first filter and the second filter is able to be made open over a wide band. Accordingly, it is possible to demultiplex or multiplex wide-band high-frequency signals whose frequency bands are close to each other while reducing or preventing the loss in the pass band of the first filter.

Furthermore, the resonator defining the low pass filter and the resonator defining the high pass filter may be provided as separate chips.

This makes it possible to widen a frequency difference between the attenuation pole defined by the resonator defining the low pass filter and the attenuation pole defined by the resonator defining the high pass filter. Therefore, it is possible to manufacture a multiplexer complying with a required specification of the frequency band.

Furthermore, a third filter which allows passing of a high-frequency signal of a third frequency band which does not overlap with the first frequency band and the second frequency band may be further included.

This makes it possible to further demultiplex or multiplex the high-frequency signal passing through the third filter, and thus three or more high-frequency signals having different frequency bands are able to be demultiplexed or multiplexed.

Furthermore, a fourth filter which is connected to the common terminal at a closer position to the common terminal than the first filter and the second filter and allows passing of a high-frequency signal of a fourth frequency band which includes the first frequency band and the second frequency band may be further included.

By providing the fourth filter as described above, in each of the path passing through the first filter and the path passing through the second filter, an attenuation in a frequency band different from the first frequency band and the second frequency band is able to be improved.

Furthermore, simultaneously passing of a high-frequency signal of one frequency band included in the first frequency band and a high-frequency signal of another frequency band included in the second frequency band is enabled.

This makes it possible, for example, to support CA (carrier aggregation) in which communication is performed simultaneously using a plurality of Bands defined by LTE (Long Term Evolution).

A high-frequency front end circuit according to a preferred embodiment of the present invention includes a multiplexer according to a preferred embodiment of the present invention; and an amplifier circuit connected to the multiplexer.

This makes it possible to provide a high-frequency front end circuit with low loss supporting a plurality of frequency bands.

Furthermore, the multiplexer may demultiplex a high-frequency signal input to the common terminal, and the amplifier circuit may be a low noise amplifier configured to amplify the high-frequency signal demultiplexed by the multiplexer.

Furthermore, the amplifier circuit may be a low noise amplifier, and the multiplexer may be a combiner that multiplexes the high-frequency signal amplified by the amplifier circuit and outputs from the common terminal.

Furthermore, a multiplexer according to a preferred embodiment of the present invention, a switch connected to a terminal on an opposite side from the common terminal of the first filter or the second filter, and a duplexer connected to the first filter or the second filter with the switch interposed between the duplexer and the first filter or the second filter may be further included.

A communication device according to a preferred embodiment of the present invention includes an RF signal processing circuit configured to process a high-frequency signal; and the high-frequency front end circuit according to a preferred embodiment of the present invention configured to transmit the high-frequency signal to be processed by the RF signal processing circuit between an antenna element and the RF signal processing circuit.

This makes it possible to provide a communication device with low loss supporting a plurality of frequency bands.

Multiplexers, high-frequency front end circuits, and communication devices according to preferred embodiments of the present invention are each able to demultiplex or multiplex a high-frequency signal whose frequency band is wide and close to another high-frequency signal.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 8A to 8D include diagrams for explaining a reflection characteristic of the filter according to the first preferred embodiment of the present invention.

DETAILED DESCRIPTION OF THE PREFERRED EMBODIMENTS

Figure 1:
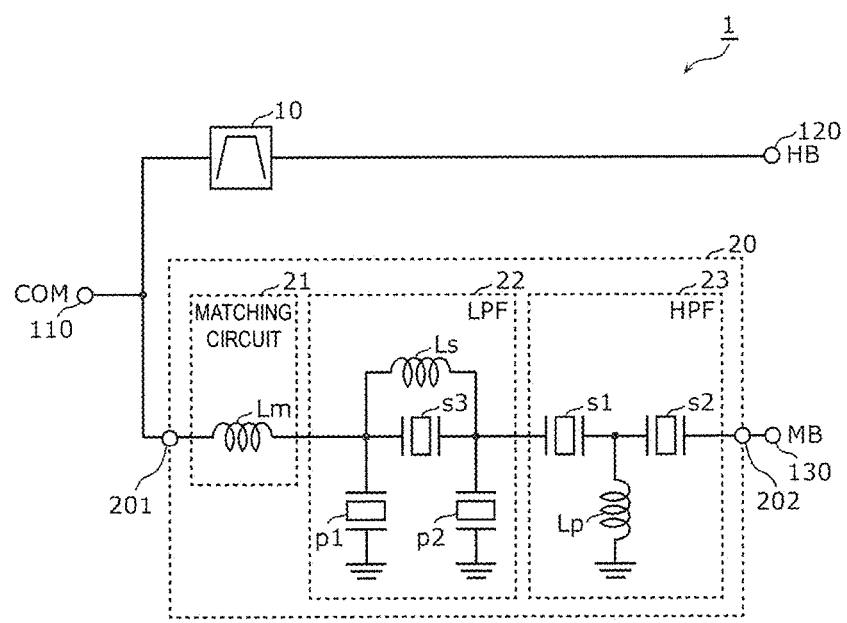
FIG. 1 is a circuit block diagram of a hybrid multiplexer according to a first preferred embodiment of the present invention.

In recent years, there has been a demand for a multiplexer for demultiplexing a high-frequency signal having a frequency band which is a wide band and close to another frequency band. In this regard, as a result of intensive research, the inventors of preferred embodiments of the present application have developed a hybrid multiplexer in which one or more capacitors included in an LC filter of the existing multiplexer are each replaced with an acoustic wave resonator. Such a hybrid multiplexer is a multiplexer having both a property of a multiplexer including an LC filter for demultiplexing a high-frequency signal having a frequency band of a wide band and a property of a multiplexer including an acoustic wave filter for demultiplexing a high-frequency signal having a frequency band close to another frequency band.

Hereinafter, multiplexers according to preferred embodiments of the present invention will be described in detail with reference to the drawings. Note that all preferred embodiments described below indicate comprehensive or specific examples. Numerical values, shapes, materials, elements, arrangement and connection configurations of the elements, and the like, which will be described in the following preferred embodiments, are examples, and are not intended to limit the scope of the present invention. Elements which are not described in independent claims among the elements in the following preferred embodiments are described as arbitrary or optional elements. In addition, sizes or size ratios of the elements illustrated in the drawings are not necessarily strict. In addition, in the drawings, configurations that are the same or substantially the same are denoted by the same reference numerals, and redundant descriptions thereof will be omitted or simplified. In addition, for a circuit element such as a resonator or the like, a constant may be appropriately adjusted in accordance with a required specification or the like. Accordingly, in the circuit element, the constant may be different even with the same sign. In addition, in the following descriptions, "a pass band low-band end" and "a pass band high-band end" refer to "a low-band end in a pass band (low frequency side end portion)" and "a high-band end in a pass band (high frequency side end portion)", respectively.

First Preferred Embodiment

Figure 2:
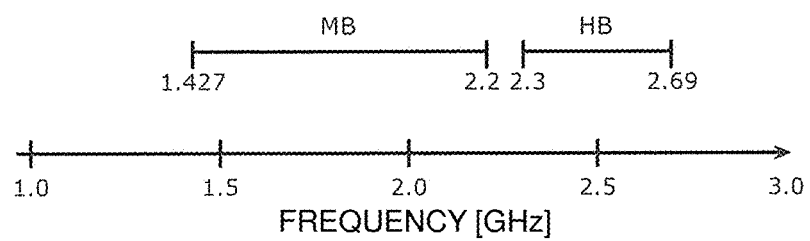
FIG. 2 is a diagram illustrating frequency bands supported by the hybrid multiplexer according to the first preferred embodiment of the present invention.

FIG. 1 is a circuit block diagram of a hybrid multiplexer according to a first preferred embodiment of the present invention. FIG. 2 is a diagram illustrating frequency bands supported by the hybrid multiplexer 1 according to the first preferred embodiment. Note that in FIG. 1, for a filter 20, a circuit configuration is also illustrated.

The hybrid multiplexer 1 includes a common terminal 110 (a COM terminal in FIG. 1), a filter 10 which allows a high-frequency signal in a first frequency band to pass therethrough, and the filter 20 which allows a high-frequency signal in a second frequency band to pass therethrough. In the present preferred embodiment, a frequency at a low-band end of the first frequency band is located on a higher-band side than a frequency at a high-band end of the second frequency band. Specifically, as illustrated in FIG. 2, the first frequency band is preferably, for example, a high band (about 2300 MHz-about 2690 MHz: hereinafter, referred to as an HB), and the second frequency band is preferably, for example, a middle band (about 1427 MHz-about 2200 MHz: hereinafter, referred to as an MB).

The hybrid multiplexer 1 as described above can be used as a diplexer for reception which performs demultiplexing of LTE compatible HB and MB. Hereinafter, the hybrid multiplexer 1 will be described as a diplexer for reception.

Note that the number and corresponding frequency bands of filters included in the hybrid multiplexer 1 are not limited to those described above.

The filter 10 is a first filter which is connected to the common terminal 110 of the hybrid multiplexer 1 and which allows a high-frequency signal of the first frequency band (the HB in the present preferred embodiment) to pass therethrough. In the present preferred embodiment, the filter 10 is a band pass filter (a BPF, hereinafter), whose pass band is preferably the HB and whose attenuated band (also referred to as a cutoff band) is preferably the MB, in which a first terminal (for example, an input terminal) is connected to the common terminal 110 and a second terminal (for example, an output terminal) is connected to an individual terminal 120 of the hybrid multiplexer 1.

Note that the filter 10 is not limited to the band pass filter, and may be a high pass filter (an HPF, hereinafter), a band elimination filter (a BEF, hereinafter), or a notch filter, for example. Additionally, a configuration of the filter 10 is not particularly limited, and an acoustic wave filter, an LC filter, a dielectric filter, or the like, for example, may be used as appropriate in accordance with a required specification or the like of size and electrical characteristics. Additionally, the filter 10 is not limited to being only one filter, and may be defined by a plurality of filters each having one terminal connected to the common terminal 110. In other words, the first frequency band is not limited to a frequency band that the one filter allows to pass therethrough, but may be a frequency band including a plurality of frequency bands that a plurality of filters allow to pass therethrough.

The filter 20 is a second filter which is connected to the common terminal 110 of the hybrid multiplexer 1 and which allows a high-frequency signal of the second frequency band (the MB in the present preferred embodiment) which does not overlap with the first frequency band (the HB in the present preferred embodiment) to pass therethrough. In the present preferred embodiment, the filter 20 is preferably a filter, whose pass band is the MB and whose attenuated band is the HB, in which a first terminal 201 is connected to the common terminal 110 and a second terminal 202 is connected to an individual terminal 130 of the hybrid multiplexer 1.

Specifically, the filter 20 includes a matching circuit 21 connected to the common terminal 110, an LPF 22, and an HPF 23.

The matching circuit 21 is connected to the common terminal 110 and includes an inductor Lm which is a matching inductor, and in the present preferred embodiment, includes the inductor Lm which is provided in series on a signal path connecting the first terminal 201 and the second terminal 202 of the filter 20. A circuit in which the matching circuit 21 and a first resonance circuit (the LPF 22 in the present preferred embodiment), which will be described later, are connected to each other exhibits low pass characteristics in the present preferred embodiment.

The LPF 22 is the first resonance circuit according to the present preferred embodiment which is cascade connected to the matching circuit 21, and includes an inductor Ls which is a first inductor provided on the signal path and a parallel arm resonator p1 which is a first parallel arm resonator connected between a node on the signal path and a ground. In the present preferred embodiment, the LPF 22 further includes a serial arm resonator s3 which is a bridging resonator bridge-connected to the inductor Ls and a parallel arm resonator p2 which is a second parallel arm resonator connected between a node on the signal path and the ground.

Here, each of the parallel arm resonators p1 and p2 and the serial arm resonator s3 is preferably an acoustic wave resonator. Furthermore, in the present preferred embodiment, of the parallel arm resonator p1 and the parallel arm resonator p2, one is connected to the node on one terminal side of the inductor Ls, and the other is connected to the node on the other terminal side of the inductor Ls. That is, the LPF 22 according to the present preferred embodiment preferably includes three acoustic wave resonators connected in a π shape, for example, and the inductor Ls is bridge-connected to the acoustic wave resonator on the serial arm.

As the acoustic wave resonator, for example, a SAW resonator using a Surface Acoustic Wave (SAW), a piezoelectric thin film resonator (FBAR: Film Bulk Acoustic Resonator, SMR: Solidly Mounted Resonator) using a bulk wave (BAW: Bulk Acoustic Wave), a resonator using a boundary acoustic wave (Boundary Elastic Wave), or the like may preferably be used. In addition, each acoustic wave resonator is not limited to being defined by one acoustic wave resonator, and may include a plurality of divided resonators obtained by dividing one acoustic wave resonator.

In the case of the SAW resonator, a substrate and an IDT (Interdigital transducer) electrode are included. The substrate has piezoelectricity on at least a surface thereof. For example, the substrate may be defined by a multilayer body including a piezoelectric thin film on the surface thereof and made of a film having a different acoustic velocity from that of the piezoelectric thin film, a support substrate, and the like. The substrate may be, for example, a multilayer body including a high acoustic velocity support substrate and a piezoelectric thin film provided on the high acoustic velocity support substrate, a multilayer body including a high acoustic velocity support substrate, a low acoustic velocity film provided on the high acoustic velocity support substrate, and a piezoelectric thin film provided on the low acoustic velocity film, or a multilayer body including a support substrate, a high acoustic velocity film provided on the support substrate, a low acoustic velocity film provided on the high acoustic velocity film, and a piezoelectric thin film provided on the low acoustic velocity film. Moreover, the substrate may have the piezoelectricity on the entire substrate. In this case, the substrate is preferably a piezoelectric substrate made of a single piezoelectric body layer, for example.

Note that in the present preferred embodiment, the parallel arm resonator p1 has been described as the first parallel arm resonator, and the parallel arm resonator p2 has been described as the second parallel arm resonator. However, the correspondence of these may be reversed, and the parallel arm resonator p2 may be the first parallel arm resonator, and the parallel arm resonator p1 may be the second parallel arm resonator.

Furthermore, it is sufficient for the LPF 22 to include the first inductor (the inductor Ls in the present preferred embodiment) and the first parallel arm resonator, and the configuration thereof is not limited to that described above. For example, the LPF 22 may not be provided with at least one of the serial arm resonator s3 and the second parallel arm resonator, or may have a configuration in which a serial arm resonator and a parallel arm resonator are further connected to the above configuration.

The HPF 23 is the second resonance circuit according to the present preferred embodiment which is cascade connected to the first resonance circuit, and includes a serial arm resonator s1 which is a first serial arm resonator provided on the signal path and an inductor Lp which is a second inductor connected between a node on the signal path and the ground. In the present preferred embodiment, the HPF 23 preferably further includes a serial arm resonator s2 which is a second serial arm resonator provided on the signal path.

Here, each of the serial arm resonators s1 and s2 is preferably an acoustic wave resonator. Furthermore, in the present preferred embodiment, the serial arm resonator s1 and the serial arm resonator s2 are connected to each other with the node, to which the inductor Lp is connected, on the signal path interposed therebetween.

Note that in the present preferred embodiment, the serial arm resonator s1 has been described as the first serial arm resonator, and the serial arm resonator s2 has been described as the second serial arm resonator. However, the correspondence of these may be reversed, and the serial arm resonator s2 may be the first serial arm resonator, and the serial arm resonator s1 may be the second serial arm resonator.

Furthermore, it is sufficient for the HPF 23 to include the first serial arm resonator and the inductor Lp which is the second inductor, and the configuration is not limited to that described above. For example, the HPF 23 may not be provided with the second serial arm resonator, or may have a configuration in which a serial arm resonator and a parallel arm resonator are further connected to the above configuration.

The hybrid multiplexer 1 configured as described above has both a property of a multiplexer including the LC filter for demultiplexing a high-frequency signal having a frequency band of a wide band and a property of a multiplexer including the acoustic wave filter for demultiplexing a high-frequency signal having a frequency band close to another frequency band. This makes it possible for the hybrid multiplexer 1 to demultiplex at least one high-frequency signal (the high-frequency signal of the MB in the present preferred embodiment) whose frequency band is a wide band and whose interval to another frequency band (that is, a gap between bands) is narrow. Here, the "wide band" means that a specific band is equal to or more than about 30%, for example, and the "gap between bands is narrow" means that the gap between bands is less than about 5%, for example.

This will be described in detail below.

Figure 3:
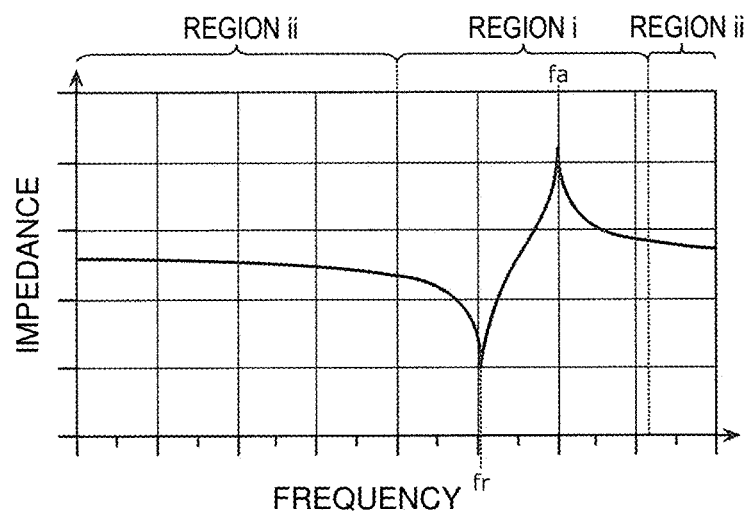
FIG. 3 is a graph showing impedance characteristics of a typical acoustic wave resonator.

FIG. 3 is a graph showing impedance characteristics of a typical acoustic wave resonator.

As shown in the graph, the acoustic wave resonator has a resonant frequency fr at which impedance is minimum (ideally 0), and an anti-resonant frequency fa at which impedance is maximum (ideally infinite). The impedance of the acoustic wave resonator exhibits a capacitive property in a frequency band on a lower-band side than the resonant frequency fr and a frequency band on a higher-band side than the anti-resonant frequency fa, and exhibits an inductive property in a frequency band between the resonant frequency fr and the anti-resonant frequency fa.

Accordingly, the acoustic wave resonator defines and functions as a resonator having a high Q value in a region i which is a frequency band between the resonant frequency fr and the anti-resonant frequency fa and a frequency band in the vicinity thereof, and on the other hand, defines and functions as a capacitor in a region in which is a frequency band on a sufficiently lower-band side than the resonant frequency and a frequency band on a sufficiently higher-band side than the anti-resonant frequency.

Figure 4:
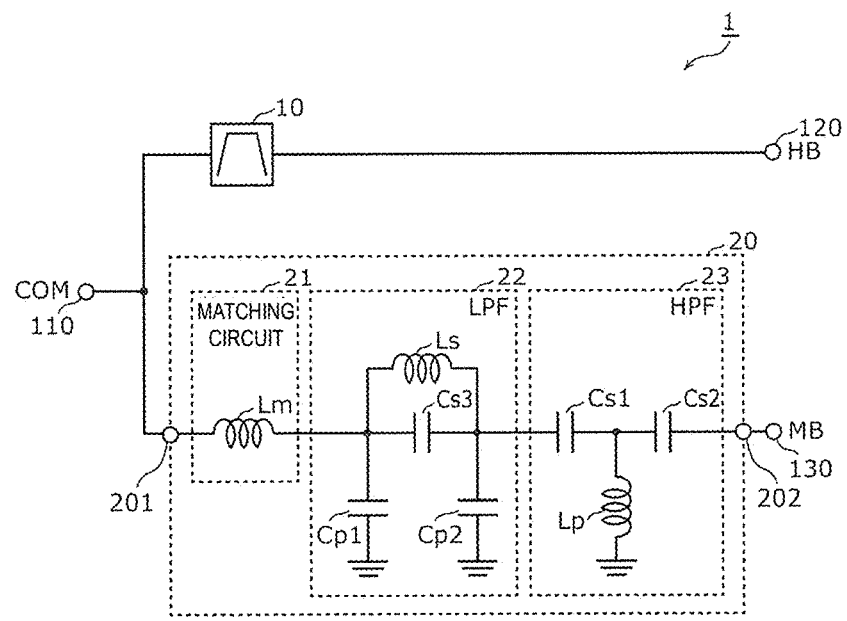
FIG. 4 is a diagram illustrating an equivalent circuit of the hybrid multiplexer in a case where each acoustic wave resonator defines and functions as a capacitor in the first preferred embodiment of the present invention.

Based on the above-described characteristics of the acoustic wave resonator, in a frequency band in which all of the acoustic wave resonators (in the present preferred embodiment, the serial arm resonators s1 to s3 and the parallel arm resonators p1 and p2) each define and function as a capacitor, as illustrated in FIG. 4, the hybrid multiplexer 1 defines and functions as a multiplexer defined by an LC filter in which each of the acoustic wave resonators is replaced with a capacitor.

Figure 5A:
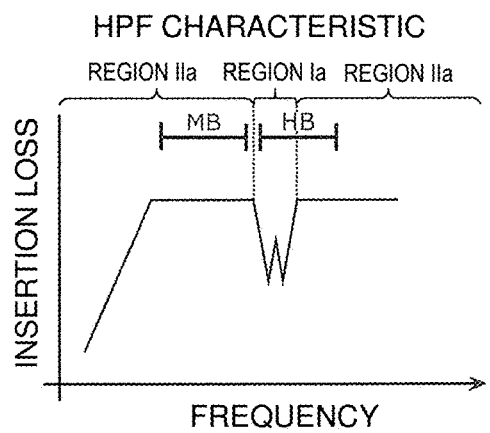
FIGS. 5A to 5C include schematic diagrams for explaining a concept of a bandpass characteristic of the hybrid multiplexer according to the first preferred embodiment of the present invention.
Figure 5B:
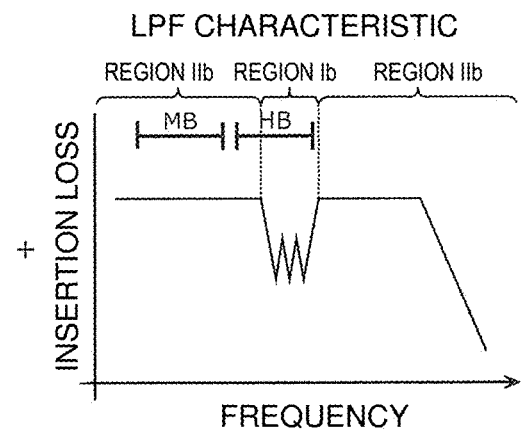
Figure 5B:
Figure 5C:
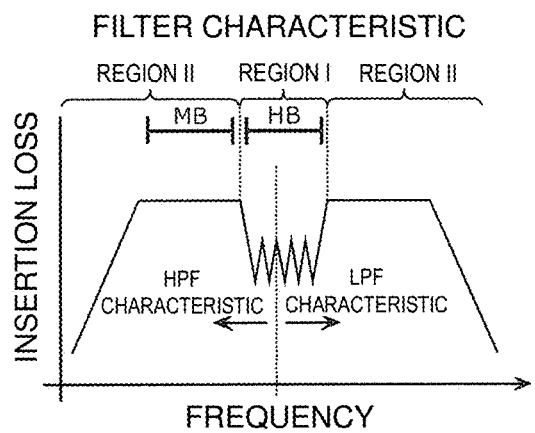

FIG. 4 is a diagram illustrating an equivalent circuit of the hybrid multiplexer 1 in a case where each acoustic wave resonator defines and functions as a capacitor in the first preferred embodiment. FIGS. 5A to 5C includes schematic diagrams for explaining a concept of a bandpass characteristic of the hybrid multiplexer 1 according to the first preferred embodiment. Specifically, FIG. 5A schematically illustrates a bandpass characteristic of the HPF 23, FIG. 5B schematically illustrates a bandpass characteristic of the LPF 22, and FIG. 5C schematically illustrates a bandpass characteristic of the entire filter 20 by combining FIGS. 5A and 5B.

As illustrated in FIG. 4, when each of the acoustic wave resonators defines and functions as a capacitor, the serial arm resonators s1 to s3 and the parallel arm resonators p1 and p2 can be regarded as capacitors Cs1 to Cs3 and capacitors Cp1 and Cp2, respectively. Accordingly, in this case, the filter 20 corresponding to the MB includes the LPF 22 and the HPF 23 each of which is defined by an LC resonance circuit. Specifically, in this case, preferably, the LPF 22 exhibits characteristics of an LC resonance circuit including a π shaped LC resonance circuit including the capacitors Cp1 and Cp2 and the inductor Ls and an LC resonance circuit including the capacitor Cs3 bridge-connected to the inductor Ls. Furthermore, the HPF 23 exhibits characteristics of a T shaped LC resonance circuit including the capacitors Cs1 and Cs2 and the inductor Lp.

In this regard, as illustrated in FIG. 5B, in a frequency band (a "region IIb" in the diagram) in which the parallel arm resonators p1 and p2 and the serial arm resonator s3 are regarded as the capacitors Cp1, Cp2 and Cs3, respectively, the LPF 22 preferably has a cutoff frequency on a higher-band side than a frequency (about 2200 MHz, for example) of an MB high-band end, and in the present preferred embodiment, preferably has the cutoff frequency on a higher-band side than a frequency (about 2690 MHz, for example) of an HB high-band end. Furthermore, as illustrated in FIG. 5A, in a frequency band (a "region IIa" in the diagram) in which the serial arm resonators s1 and s2 are regarded as the capacitors Cs1 and Cs2, respectively, the HPF 23 preferably has a cutoff frequency on a lower-band side than a frequency (about 1427 MHz, for example) of an MB low-band end.

Note that it is sufficient that the cutoff frequency of the LPF 22 described here is on the higher-band side than the frequency of the MB high-band end, and the frequency may be on the lower-band side than the frequency of the HB high-band end.

On the other hand, when each of the acoustic wave resonators defines and functions as a resonator, the serial arm resonators s1 to s3 and the parallel arm resonators p1 and p2 can be regarded as traps providing attenuation poles. Specifically, each of the serial arm resonators s1 to s3 is a serial trap which provides an attenuation pole by an anti-resonant frequency, and provides an attenuation pole having a steep attenuation slope. Each of the parallel arm resonators p1 and p2 is a parallel trap which provides an attenuation pole by a resonant frequency, and provides an attenuation pole having a steep attenuation slope. Accordingly, in this case, the LPF 22 and the HPF 23 each exhibit characteristics in which one or more attenuation poles having steep attenuation slopes provided by the serial trap and the parallel trap are included.

In this regard, as illustrated in FIG. 5B, in a frequency band (a "region Ib" in the diagram) in which the parallel arm resonators p1 and p2 and the serial arm resonator s3 each define and function as a resonator, the LPF 22 includes three attenuation poles provided by these resonators. Additionally, as illustrated in FIG. 5A, in a frequency band (a "region Ia" in the diagram) in which the serial arm resonators s1 and s2 each define and function as a resonator, the HPF 23 includes two attenuation poles provided by these resonators.

By the LPF 22 and the HPF 23 being cascade connected, as illustrated in FIG. 5C, the filter 20 defines a band pass filter for a wide band in a frequency band (a "region II" in the diagram) in which each acoustic wave resonator defines and functions as the capacitor, and provides an attenuation pole group including the five steep attenuation poles in a frequency band (a "region I" in the diagram) in which each acoustic wave resonator defines and functions as the resonator.

Accordingly, the hybrid multiplexer 1 is designed such that the attenuation pole group is located in the HB which is the pass band of the filter 10, and thus is able to demultiplex the high-frequency signal of the HB and the high-frequency signal of the MB. This will be described in detail below.

Figure 6A:
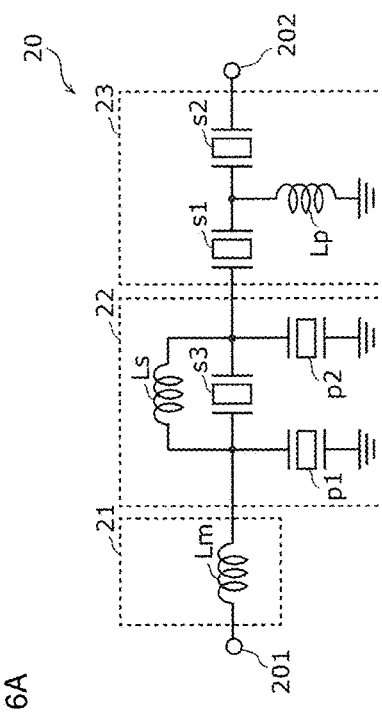
FIGS. 6A and 6B include diagrams for explaining impedance characteristics of each acoustic wave resonator of a filter according to the first preferred embodiment of the present invention.
Figure 6B:
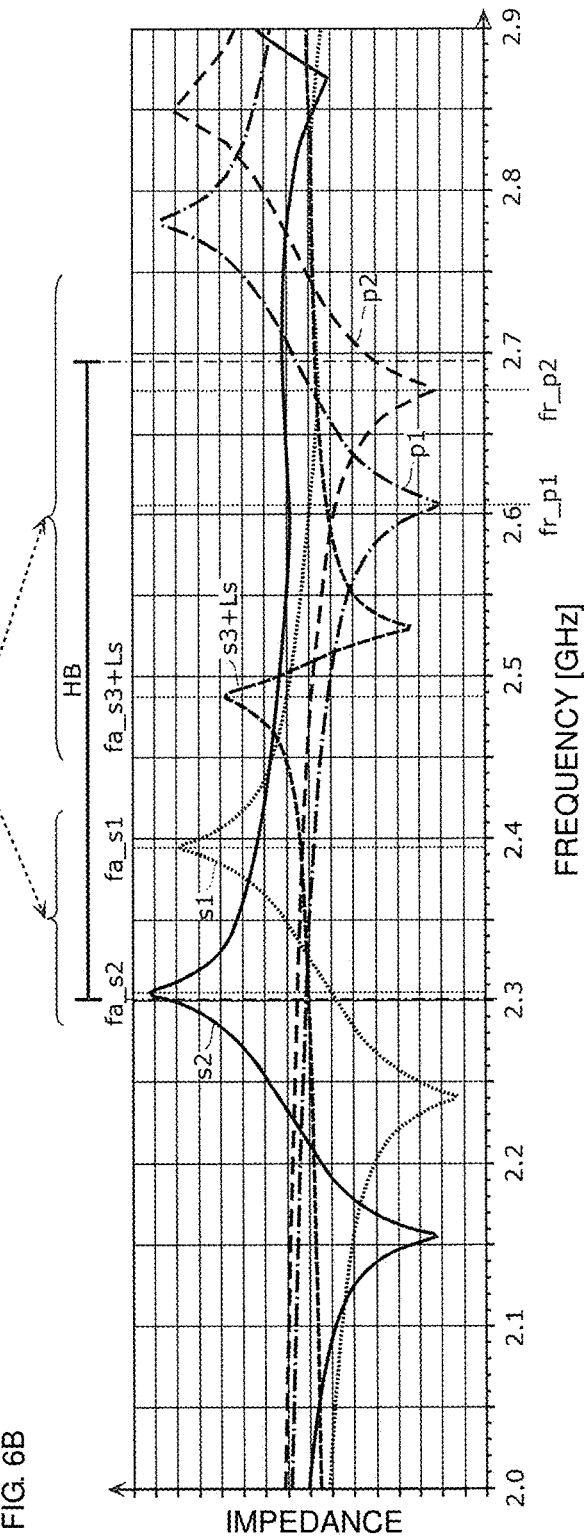

FIGS. 6A and 6B include diagrams for explaining impedance characteristics of each acoustic wave resonator of the filter 20 according to the first preferred embodiment. Specifically, FIG. 6A illustrates the circuit configuration of the filter 20, and FIG. 6B illustrates a graph showing impedance characteristics of each of the serial arm resonators s1 to s3 and the parallel arm resonators p1 and p2.

Note that for the serial arm resonator s3 bridge-connected to the inductor Ls, the graph shows not impedance characteristics of the serial arm resonator s3 but combined impedance characteristics with the inductor Ls. Furthermore, the impedance of the acoustic wave resonator includes, in some cases, not only the impedance of the acoustic wave resonator alone but also a capacitance component and an inductance component of an element or a wiring line connected to the acoustic wave resonator. Therefore, each of the resonant frequency and the anti-resonant frequency of the acoustic wave resonator is not limited to a predetermined frequency defined by design parameters of the acoustic wave resonator, but may be a frequency different from the predetermined frequency by being affected by the element or the wiring line connected to the acoustic wave resonator. Furthermore, the acoustic wave resonator may have a sub-resonant frequency different from the resonant frequency and a sub-anti-resonant frequency different from the anti-resonant frequency by being affected as described above.

As shown in the graph, in the present preferred embodiment, a resonant frequency fr_p1 of the parallel arm resonator p1, a resonant frequency fr_p2 of the parallel arm resonator p2, an anti-resonant frequency fa_s1 of the serial arm resonator s1, an anti-resonant frequency fa_s2 of the serial arm resonator s2, and a sub-anti-resonant frequency fa_s3+Ls of the serial arm resonator s3 are all positioned between a frequency (about 2300 MHz) of an HB low-band end and the frequency (about 2690 MHz) of the HB high-band end. That is, all of these frequencies are located in the HB.

Here, the sub-anti-resonant frequency fa_s3+Ls of the serial arm resonator s3 is a frequency different from the anti-resonant frequency of the serial arm resonator s3 among a plurality of anti-resonant frequencies included in the circuit in which the inductor Ls and the serial arm resonator s3 are bridge-connected. In other words, this sub-anti-resonant frequency is a frequency at which combined impedance of the serial arm resonator s3 and the inductor Ls locally increases due to the serial arm resonator s3 being bridge-connected to the inductor Ls.

Additionally, as shown in the graph, in the present preferred embodiment, the resonant frequency fr_p1 of the parallel arm resonator p1 and the resonant frequency fr_p2 of the parallel arm resonator p2 are each located on a higher-band side than both the anti-resonant frequency fa_s1 of the serial arm resonator s1 and the anti-resonant frequency fa_s2 of the serial arm resonator s2. That is, a resonant frequency group including the resonant frequencies fr_p1 and fr_p2 of the parallel arm resonators p1 and p2 defining the LPF 22 is located on the higher-band side than an anti-resonant frequency group including the anti-resonant frequencies fa_s1 and fa_s2 of the serial arm resonators s1 and s2 defining the HPF 23.

Additionally, as shown in the graph, in the present preferred embodiment, the sub-anti-resonant frequency fa_s3+Ls of the serial arm resonator s3 is located between the anti-resonant frequency group and the resonant frequency group.

To summarize the above description, in the present preferred embodiment, the following frequency relationship is satisfied.

HB low-band end frequency (about 2300 MHz, for example) <fa_s2<fa_s1<fa_s3+Ls<fr_p1<fr_p2<HB high-band end frequency (about 2690 MHz, for example)

Figure 7:
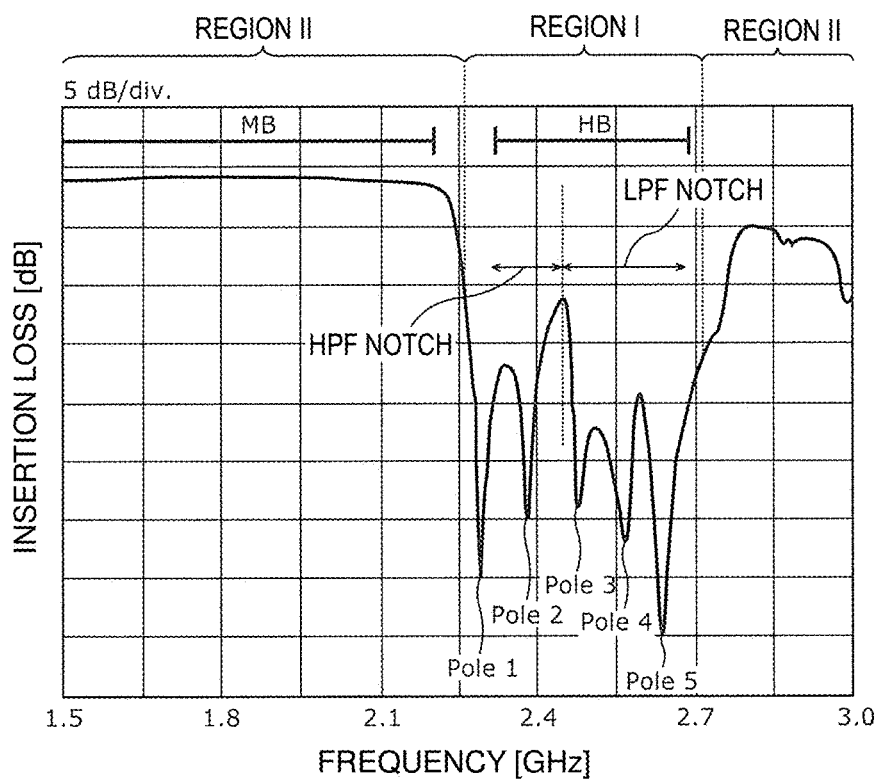
FIG. 7 is a graph showing a bandpass characteristic of the filter according to the first preferred embodiment of the present invention.

FIG. 7 is a graph showing the bandpass characteristics of the filter 20 according to the present preferred embodiment.

As is apparent from the graph, by the serial arm resonators s1 to s3 and the parallel arm resonators p1 and p2 each defining and functioning as a capacitor in the region II, the filter 20 achieves a bandpass characteristic which is flat or substantially flat in a wide band over the entire MB which is a pass band. Furthermore, by the serial arm resonators s1 to s3 and the parallel arm resonators p1 and p2 each defining and functioning as a resonator having the high Q value in the region I, the filter 20 includes five attenuation poles Pole 1 to Pole 5 in the HB. With this configuration, attenuation characteristics are achieved which have steep attenuation slopes in the frequency band from the MB high-band end to the HB low-band end and secure a sufficient attenuation over the entire HB.

Here, from the frequency relationship described above, the attenuation pole Pole 1 is provided by the anti-resonant frequency fa_s1 of the serial arm resonator s1, and the attenuation pole Pole 2 is provided by the anti-resonant frequency fa_s2 of the serial arm resonator s2. Furthermore, the attenuation pole Pole 3 is provided by the sub-anti-resonant frequency fa_s3+Ls of the serial arm resonator s3, the attenuation pole Pole 4 is provided by the resonant frequency fr_p1 of the parallel arm resonator p1, and the attenuation pole Pole 5 is provided by the resonant frequency fr_p2 of the parallel arm resonator p2.

That is, the filter 20 provides attenuation characteristics on the low-band side by notches by the serial arm resonator s1 and the serial arm resonator s2 of the HPF 23, and provides attenuation characteristics on the high-band side by notches by the serial arm resonator s3, the parallel arm resonator p1, and the parallel arm resonator p2 of the LPF 22.

The characteristics of the hybrid multiplexer 1 have been described while focusing on the bandpass characteristic of the filter 20 corresponding to the MB. Next, focusing on a reflection characteristic required for the filter 20 corresponding to the MB from a viewpoint of reducing or preventing insertion loss of the filter 10 corresponding to the HB, characteristics of the hybrid multiplexer 1 will be described.

FIGS. 8A to 8D include diagrams for explaining the reflection characteristic of the filter 20 according to the present preferred embodiment. Specifically, FIG. 8A illustrates the configuration of the hybrid multiplexer 1, and FIGS. 8B to 8D are Smith charts showing impedances Za to Zc at positions illustrated in FIG. 8A. More specifically, FIG. 8B shows an impedance Zc@HB in the HB when the HPF 23 side is viewed from an output end of the LPF 22, FIG. 8C shows an impedance Zb@HB in the HB when the LPF 22 side is viewed from an output end of the matching circuit 21, and FIG. 8D shows an impedance Za@HB in the HB when the filter 20 is viewed from the common connection point between the filter 10 and the filter 20.

First, in the serial arm resonators s1 and s2 of the HPF 23, the impedance is maximized (ideally infinite) at the anti-resonant frequencies fa_s1 and fa_s2, and the anti-resonant frequencies fa_s1 and fa_s2 are located in the HB. Therefore, as shown in FIG. 8B, the impedance Zc@HB viewed from the output end of the LPF 22 is located close to the open circuit on the Smith chart.

Next, by the LPF 22 connected to the HPF 23, a phase is shifted clockwise from the impedance Zc@HB on the Smith chart. Therefore, as shown in FIG. 8C, the impedance Zb@HB when the LPF 22 side is viewed from the output end of the matching circuit 21 is located close to the short circuit on the Smith chart. In addition, the impedance on the high-band side of the HB which is close to the center on the Smith chart in FIG. 8B is shifted close to the short circuit as shown in FIG. 8C by resonance of each of the parallel arm resonators p1 and p2 and anti-resonance of the serial arm resonator s3, configuring the LPF 22. Therefore, the impedance when the LPF 22 side is viewed from the output end of the matching circuit 21 is brought closer to the short circuit on the Smith chart over the entire band of the HB.

Next, by the inductor Lm defining the matching circuit 21 connected to the LPF 22, the phase is shifted clockwise from the impedance Zb@HB on the Smith chart. Therefore, as shown in FIG. 8D, by appropriately adjusting an inductance value of the inductor Lm, the impedance Za@HB viewed from the common connection point between the filter 10 and the filter 20 can be located close to the open circuit on the Smith chart.

That is, when viewed from the common terminal 110 side, the filter 20 corresponding to the MB can be brought into a pseudo-open state with a high impedance over the entire HB. With this configuration, the high-frequency signal passing through the filter 10 is hardly leaked to the filter 20 over the entire HB. Accordingly, in the filter 10 corresponding to the HB as well, a bandpass characteristic, which is flat in a wide band, in which the insertion loss is reduced or prevented over the entire HB is able to be achieved, and thus the demultiplexing characteristics are improved.

Figure 9:
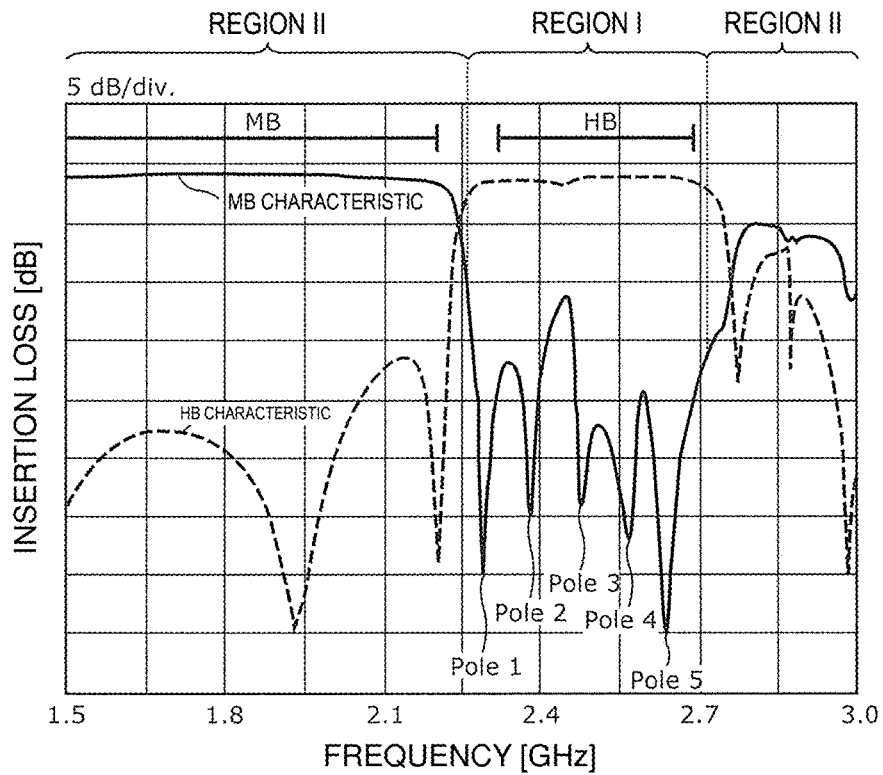
FIG. 9 is a graph showing the bandpass characteristic of the hybrid multiplexer according to the first preferred embodiment of the present invention.

FIG. 9 is a graph showing the bandpass characteristics of the hybrid multiplexer 1 according to the present preferred embodiment. Specifically, the graph shows a bandpass characteristic of a path in which the filter 10 corresponding to the HB is provided (hereinafter referred to as HB characteristics) and a bandpass characteristic of a path in which the filter 20 corresponding to the MB is provided (hereinafter referred to as MB characteristics).

As shown in the graph, for the HB characteristics, the bandpass characteristic, which is flat or substantially flat in a wide band, in which the insertion loss is reduced or prevented over the entire HB is achieved. That is, the hybrid multiplexer 1 is able to demultiplex the high-frequency signal of the MB and the high-frequency signal of the HB which are the wide-band high-frequency signals whose frequency bands are close to each other.

Advantageous effects obtained by the hybrid multiplexer 1 according to the present preferred embodiment will be described below. Note that in the present preferred embodiment, the case where the hybrid multiplexer 1 demultiplexes the high-frequency signal is provided as an example and described, but the hybrid multiplexer 1 may also multiplex the high-frequency signal. In this regard, since description can be commonly used for the demultiplexing characteristics and the multiplexing characteristics, the demultiplexing characteristics are mainly described below, and the description of the multiplexing characteristics is simplified or omitted.

As described above, according to the present preferred embodiment, each of the first parallel arm resonator (one of the parallel arm resonators p1 and p2 in the present preferred embodiment) and the first serial arm resonator (one of the serial arm resonators s1 and s2 in the present preferred embodiment) is the acoustic wave resonator, and the resonant frequency of the first parallel arm resonator and the anti-resonant frequency of the first serial arm resonator are located between the frequency at the HB low-band end and the frequency at the HB high-band end. Here, the acoustic wave resonator defines and functions as a resonator having a high Q value between the resonant frequency and the anti-resonant frequency and in the vicinity thereof, and defines and functions as a capacitor on a sufficiently lower-band side than the resonant frequency and a sufficiently higher-band side than the anti-resonant frequency.

Accordingly, the filter 20 includes the attenuation pole group provided by the resonant frequency of the first parallel arm resonator and the anti-resonant frequency of the first serial arm resonator in the frequency band between the frequency at the HB low-band end and the frequency at the HB high-band end. The attenuation characteristics with this attenuation pole group have steepness and an attenuation defined by the acoustic wave resonator, and therefore have high steepness and a sufficient attenuation. Additionally, the filter 20 has the characteristics of the LC resonance circuit defined by each of the first parallel arm resonator and the first serial arm resonator defining and functioning as a capacitor outside the above-described frequency band, and specifically has a bandpass characteristic in which the loss is reduced or prevented over a wide band.

That is, the filter 20 has the bandpass characteristic in which the loss is reduced or prevented over a wide band outside the pass band of the filter 10 and the steep attenuation occurs in the pass band of the filter 10. For this reason, according to the present preferred embodiment, the high-frequency signal whose frequency band is wide and close to another high-frequency signal is able to be demultiplexed.

Furthermore, according to the present preferred embodiment, in the filter 20, the matching circuit 21, the LPF 22, and the HPF 23 are cascade connected. With this configuration, by appropriately adjusting a configuration of the matching circuit 21 and a connection order between the LPF 22 and the HPF 23, it is possible to make impedance in the HB when the filter 20 is viewed from the common terminal 110 side high.

Accordingly, leakage of the high-frequency signal passing through the filter 10 to the filter 20 side is able to be reduced or prevented, and thus the demultiplexing characteristics are improved.

Furthermore, according to the present preferred embodiment, the frequency at the low-band end of the first frequency band (that is, the HB low-band end) that the filter 10 allows to pass therethrough is located on a higher-band side than the frequency at the high-band end of the second frequency band (that is, the MB high-band end) that the filter 20 allows to pass therethrough. Furthermore, the matching circuit 21 is defined by the inductor Lm provided in series on the signal path, the first resonance circuit which is cascade connected to the matching circuit 21 is the LPF 22, and the second resonance circuit which is cascade connected to the first resonance circuit is the HPF 23.

With this configuration, the circuit of the filter 20 on the side closest to the filter 10 is defined by the circuit which includes the matching circuit 21 and the LPF 22 and exhibits the low pass characteristics. Accordingly, since a reflection coefficient in the HB when the filter 20 is viewed from the common terminal 110 side can be brought close to one over a wide band, the demultiplexing characteristics or the multiplexing characteristics are improved.

Additionally, by appropriately adjusting the inductance value of the inductor Lm, the impedance in the HB when the filter 20 is viewed from the common connection point between the filter 10 and the filter 20 can be made open over a wide band. Accordingly, it is possible to reduce or prevent the loss in the pass band of the filter 10.

In other words, according to the present preferred embodiment, by the circuit in which the matching circuit 21 and the first resonance circuit (LPF 22) are cascade connected exhibiting the low pass characteristics, since the reflection coefficient in the HB when the filter 20 is viewed from the filter 10 can be brought close to one over a wide band, the demultiplexing characteristics are improved.

Furthermore, according to the present preferred embodiment, by the resonant frequency of the first parallel arm resonator being located on the higher-band side than the anti-resonant frequency of the first serial arm resonator, the impedance in the HB when the filter 20 is viewed from the common connection point between the filter 10 and the filter 20 can be made open over a wide band. Accordingly, it is possible to reduce or prevent the loss in the pass band of the filter 10.

Furthermore, according to the present preferred embodiment, by the sub-anti-resonant frequency of the serial arm resonator s3 being located between the frequency at the HB low-band end and the frequency at the HB high-band end, the number of attenuation poles provided in the filter 20 is increased, and thus it is possible to widen the frequency band in which a sufficient attenuation is able to be secured. Accordingly, it is possible to demultiplex wide-band high-frequency signals whose frequency bands are close to each other.

Furthermore, according to the present preferred embodiment, the sub-anti-resonant frequency is located between the anti-resonant frequency group of the serial arm resonators s1 and s2 of the HPF 23 and the resonant frequency group of the parallel arm resonators p1 and p2 of the LPF 22. This makes it possible to widen a frequency difference between the anti-resonant frequency of the first serial arm resonator and the resonant frequency of the first parallel arm resonator, and thus in the second filter, the frequency band in which the attenuation is secured by the attenuation pole group is able to be widened. That is, since the second filter capable of obtaining attenuation characteristics in a wider band can be provided, the wide-band high-frequency signals are able to be demultiplexed.

Furthermore, according to the present preferred embodiment, the LPF 22 further includes the second parallel arm resonator (the other of the parallel arm resonators p1 and p2 in the present preferred embodiment), and the HPF 23 further includes the second serial arm resonator (the other of the serial arm resonators s1 and s2 in the present preferred embodiment). Furthermore, the resonant frequency of each of the parallel arm resonators p1 and p2 and the anti-resonant frequency of each of the serial arm resonators s1 and s2 have the above-described frequency relationship.

With this configuration, in the filter 20, since the number of attenuation poles to be provided is increased, it is possible to widen the frequency band in which sufficient attenuation is able to be secured. Additionally, the impedance in the HB when the filter 20 is viewed from the common connection point between the filter 10 and the filter 20 can be made open over a wide band. Accordingly, it is possible to demultiplex or multiplex wide-band high-frequency signals whose frequency bands are close to each other while reducing or preventing the loss in the pass band of the filter 10.

Furthermore, in the hybrid multiplexer 1 as described above, the resonator configuring the LPF 22 and the resonator configuring the HPF 23 may be provided in separate chips.

This makes it possible to widen a frequency difference between the attenuation pole provided by the resonator defining the LPF 22 and the attenuation pole provided by the resonator defining the HPF 23. Therefore, it is possible to manufacture a multiplexer that complies with a required specification of the frequency band.

However, from a viewpoint of miniaturization, it is preferable that the resonator defining the LPF 22 and the resonator defining the HPF 23 are provided in one chip. Therefore, whether to configure these using separate chips or configure these using one chip may be determined as appropriate in consideration of size, the frequency band, and the like.

First Modification of First Preferred Embodiment

Note that the configuration of the filter corresponding to the MB is not limited to the configuration of the first preferred embodiment. Therefore, in the present modification, a hybrid multiplexer including a filter corresponding to the MB and having a configuration different from that of the first preferred embodiment will be described.

Figure 10:
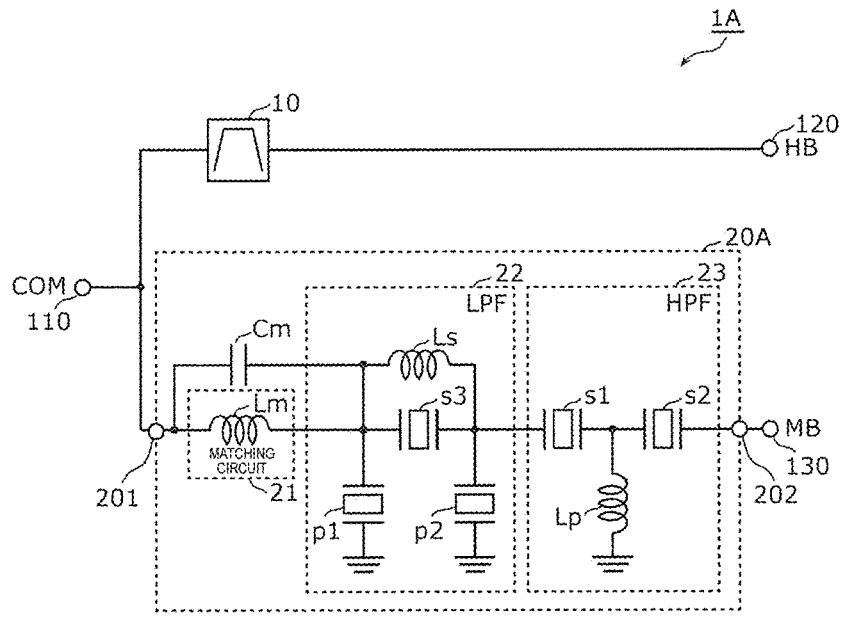
FIG. 10 is a circuit block diagram of a hybrid multiplexer according to a first modification of the first preferred embodiment of the present invention.

FIG. 10 is a circuit block diagram of a hybrid multiplexer 1A according to a first modification of the first preferred embodiment. Note that in FIG. 10, for a filter 20A, a circuit configuration is also illustrated.

The filter 20A illustrated in the diagram further includes a capacitor Cm connected in parallel to the inductor Lm, which is the matching inductor, in comparison with the filter 20 in the above-described first preferred embodiment.

A resonant frequency of the parallel circuit of the inductor Lm and the capacitor Cm is located in a frequency band obtained by multiplying the MB (about 1427 MHz-about 2200 MHz, for example), which is the second frequency band, by an integer equal to or more than two, and in the present preferred embodiment modification, is preferably located in a frequency band about twice the MB, for example. The resonant frequency is appropriately adjusted by a capacitance value of the capacitor Cm. Accordingly, the resonant frequency is not limited to that described above, may be in a frequency band about three times the MB, for example, and may be appropriately adjusted in accordance with an environment or the like in which the hybrid multiplexer 1A is used.

Figure 11:
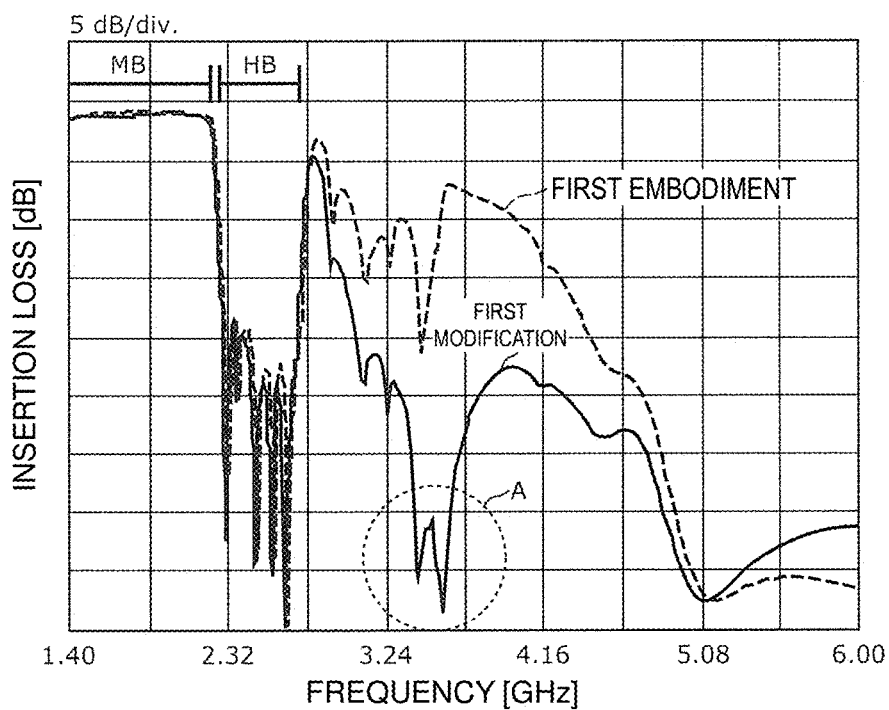
FIG. 11 is a graph showing a bandpass characteristic of a filter according to the first modification of the first preferred embodiment of the present invention.

FIG. 11 is a graph showing the bandpass characteristic of the filter 20A according to the present modification. Note that for comparison, the graph also shows the bandpass characteristic of the filter 20 according to the first preferred embodiment.

As shown in the graph, since the present modification includes the configuration of the first preferred embodiment, characteristics similar to those of the first preferred embodiment are able to be achieved in the HB and MB.

Furthermore, as shown in the graph, in the present modification, in comparison with the first preferred embodiment, by further including the capacitor Cm, attenuation in the frequency band about twice the MB is able to be obtained (A portion in the graph).

That is, according to the present modification, an attenuation pole provided by the parallel circuit of the inductor Lm and the capacitor Cm is located in the frequency band of a harmonic wave (here, a secondary harmonic wave) of the high-frequency signal passing through the filter 20A. Therefore, it is possible to reduce or prevent harmonic wave distortion (here, secondary harmonic wave distortion) of the filter 20A from occurring.

In the present modification, the frequency band about twice the pass band (that is, the MB) of the filter 20A is about 3.5 GHz band, for example, and overlaps with the UHB (Ultra High Band: about 3400 MHz-about 3800 MHz). Therefore, the hybrid multiplexer 1A capable of reducing or preventing the secondary harmonic wave distortion in the filter 20A from occurring is suitable as a multiplexer used in an environment in which the UHB is used.

Second Modification of First Preferred Embodiment

In the above-described first preferred embodiment and the first modification thereof, the first filter is described as a filter corresponding to the HB, and the second filter is described as a filter corresponding to the MB. That is, it is described that the frequency at the low-band end of the first frequency band which is the pass band of the first filter is located at a higher-band side than the frequency at the high-band end of the second frequency band which is the pass band of the second filter. However, the bands to which the first filter and the second filter correspond are not limited thereto. Accordingly, the frequency at the high-band end of the first frequency band may be located on the lower-band side than the frequency at the low-band end of the second frequency band. Therefore, in the present modification, such a hybrid multiplexer will be described.

Figure 12:
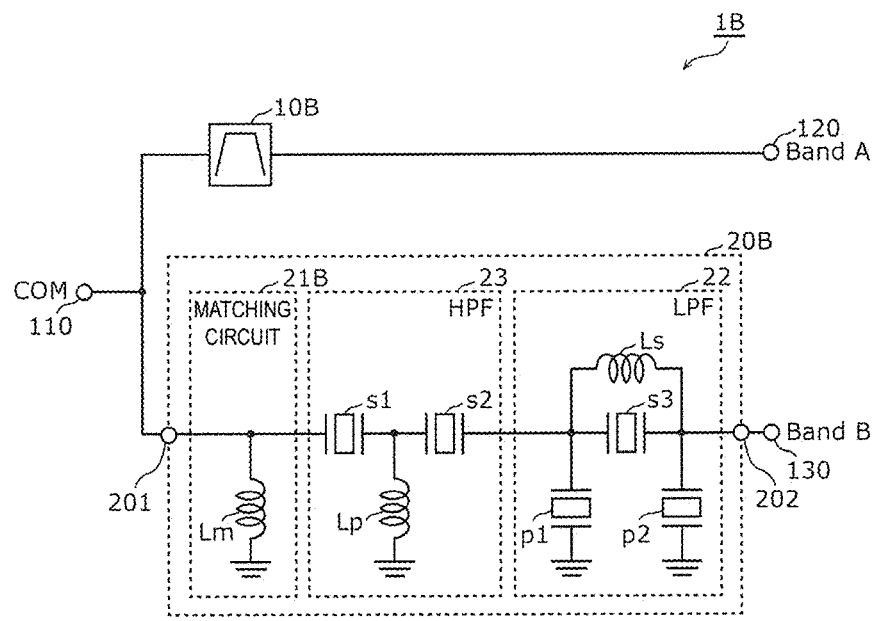
FIG. 12 is a circuit block diagram of a hybrid multiplexer according to a second modification of the first preferred embodiment of the present invention.
Figure 13:
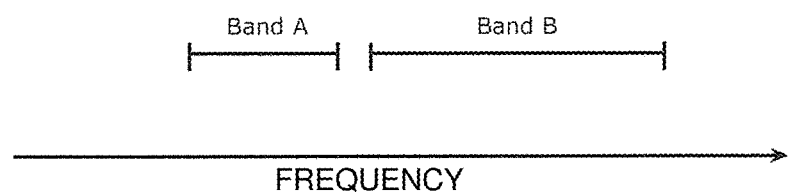
FIG. 13 is a diagram illustrating frequency bands supported by the hybrid multiplexer according to the second modification of the first preferred embodiment of the present invention.

FIG. 12 is a circuit block diagram of a hybrid multiplexer 1B according to a second modification of the first preferred embodiment. FIG. 13 is a diagram illustrating frequency bands supported by the hybrid multiplexer 1B according to the second modification of the first preferred embodiment. Note that in FIG. 12, for a filter 20B, a circuit configuration is also illustrated.

The hybrid multiplexer 1B according to the present modification is different from the hybrid multiplexer 1 according to the first preferred embodiment in a point of including a filter 10B corresponding to a Band A as the first filter for allowing passing of the first frequency band therethrough and including the filter 20B corresponding to a Band B as the second filter for allowing passing of the second frequency band therethrough. In other words, in the present modification, the first frequency band is the Band A, and the second frequency band is the Band B. Here, as illustrated in FIG. 13, a frequency at a Band A high-band end is located on a lower-band side than a frequency at a Band B low-band end.

The filter 10B is preferably the same or substantially the same as the filter 10 except that the pass band is different from that of the filter 10, and thus detailed description thereof will be omitted.

The filter 20B is different from the filter 20 according to the first preferred embodiment in that a matching circuit 21B is included instead of the matching circuit 21, and that the connection order of the HPF 23 and the LPF 22 is switched.

That is, in the first preferred embodiment, the first resonance circuit which is cascade connected to the matching circuit 21 has been described as the LPF 22, and the second resonance circuit which is cascade connected to the first resonance circuit has been described as the HPF 23. In contrast, the present modification is different in that the first resonance circuit which is cascade connected to the matching circuit 21B is the HPF 23 and the second resonance circuit which is cascade connected to the first resonance circuit is the LPF 22.

The matching circuit 21B is different from the matching circuit 21 according to the first preferred embodiment in that the inductor Lm which is the matching inductor is connected between the signal path connecting the first terminal 201 and the second terminal 202 of the filter 20 and the ground.

The hybrid multiplexer 1B configured as described above also achieves the same or substantially the same advantageous effects as those of the first preferred embodiment.

That is, the filter 20B corresponding to the Band B has an attenuation pole group provided by the resonant frequencies of the parallel arm resonators p1 and p2 and the anti-resonant frequencies of the serial arm resonators s1 to s3 in the frequency band between a frequency at a Band A low-band end and the frequency at the Band A high-band end. The attenuation characteristics provided by this attenuation pole group have steepness and an attenuation defined by the acoustic wave resonator, and therefore have high steepness and a sufficient attenuation. Additionally, the filter 20B has characteristics of the LC resonance circuit defined by each of the parallel arm resonators p1 and p2 and the serial arm resonators s1 to s3 defining and functioning as a capacitor outside the above-described frequency band, and specifically has a bandpass characteristic in which loss is reduce or prevented over a wide band.

That is, the filter 20B has a bandpass characteristic in which the loss is reduced or prevented over a wide band outside the pass band of the filter 10B corresponding to the Band A and steep attenuation occurs in the pass band of the filter 10B. Therefore, the hybrid multiplexer 1B according to the present modification is also able to demultiplex a high-frequency signal (here, a high-frequency signal of the Band B) whose frequency band is wide and close to another high-frequency signal (here, a high-frequency signal of the Band A).

Additionally, in the present modification, in the filter 20B, the matching circuit 21B defined of the inductor, the LPF 22, and the HPF 23 are cascade connected. With this configuration, by appropriately adjusting the configuration of the matching circuit 21B and the connection order between the LPF 22 and the HPF 23 in accordance with a relative relationship between frequency bands of the Band A and the Band B, it is possible to make impedance in the Band A when the filter 20B is viewed from the common terminal 110 side high.

Accordingly, leakage of the high-frequency signal passing through the filter 10B to the filter 20B side is able to be reduced or prevented, and thus the demultiplexing characteristics are improved.

Specifically, according to the present modification, by the matching circuit 21B being defined by the inductor Lm connected between the node on the signal path and the ground, a circuit of the filter 20B on a side closest to the filter 10B is defined by a circuit including the matching circuit 21B and the first resonance circuit (here, the HPF 23) and exhibits high pass characteristics. Here, the frequency at the Band A high-band end is located on the lower-band side than the frequency at the Band B low-band end. Accordingly, since a reflection coefficient in the Band A when the filter 20B is viewed from the common terminal 110 side can be brought close to one over a wide band, the demultiplexing characteristics are improved.

Additionally, by appropriately adjusting the inductance value of the inductor Lm, the impedance in the Band A when the filter 20B is viewed from the common connection point between the filter 10B and the filter 20B can be made open over a wide band, and thus the loss in the pass band of the filter 10B is able to be reduced or prevented.

Third Modification of First Preferred Embodiment

The configuration of the hybrid multiplexer described above may be applied to a configuration in which three or more high-frequency signals having different frequency bands from one another are demultiplexed. Therefore, in the present modification, such a hybrid multiplexer will be described using a triplexer that demultiplexes three high-frequency signals having different frequency bands from one another as an example.

Figure 14:
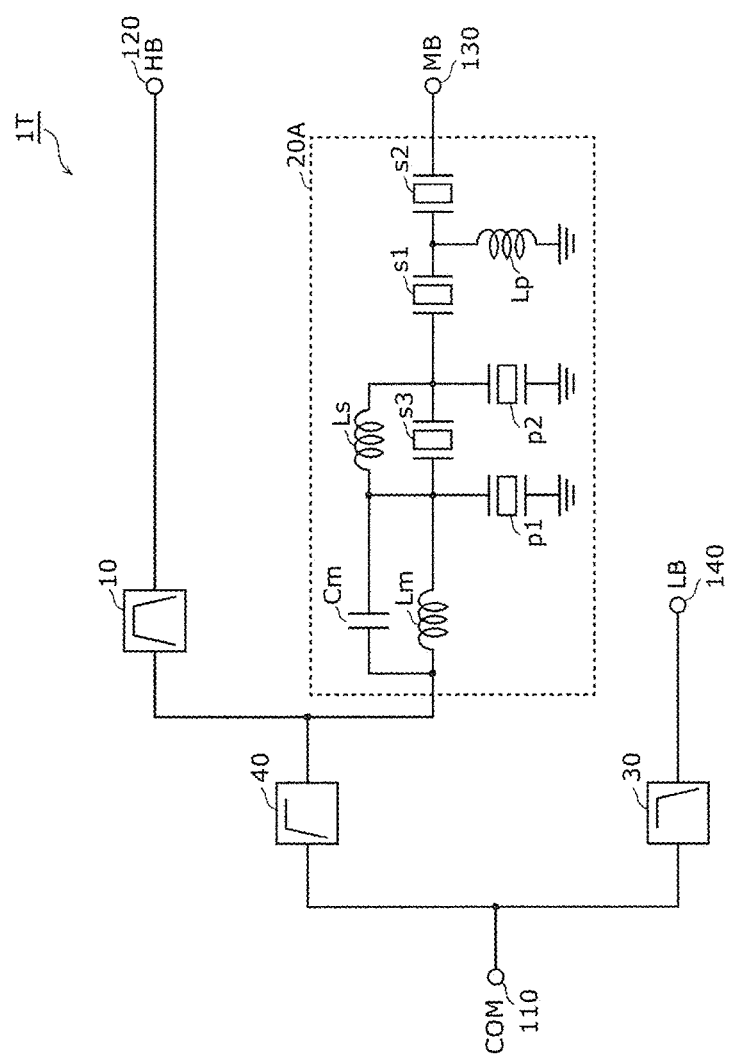
FIG. 14 is a circuit block diagram of a hybrid multiplexer according to a third modification of the first preferred embodiment of the present invention.

FIG. 14 is a circuit block diagram of a hybrid multiplexer 1T according to a third modification of the first preferred embodiment. In FIG. 14, for the filter 20A, the circuit configuration is also illustrated.

As illustrated in the diagram, the hybrid multiplexer 1T preferably includes a configuration of the hybrid multiplexer 1A according to the first modification of the first preferred embodiment including the filter 10 and the filter 20A, and further includes a filter 30 and a filter 40.

The filter 30 is a third filter which is connected to the common terminal 110 and allows a high-frequency signal of a third frequency band which does not overlap with the first frequency band (the HB in the present modification) and the second frequency band (the MB in the present modification) to pass therethrough. In the present modification, the third frequency band is preferably a low band (for example, about 698 MHz-about 960 MHz: hereinafter, referred to as an LB), and the filter 30 is a filter connected between the common terminal 110 and an individual terminal 140 and corresponding to the LB.

The filter 40 is a fourth filter which is connected to the common terminal 110 at a closer position thereto than the filter 10 and the filter 20A and which allows a high-frequency signal of a fourth frequency band including the HB which is the pass band of the filter 10 and the MB which is the pass band of the filter 20A to pass therethrough. For example, the filter 40 is preferably a high pass filter having a cutoff frequency between a frequency at a pass band high-band end of the filter 30 and the frequency at the MB low-band end.

The hybrid multiplexer 1T configured as described above preferably includes the configuration of the hybrid multiplexer 1A according to the first modification of the first preferred embodiment, and thus the same or substantially advantageous effects as those of the first modification of the first preferred embodiment are obtained.

Furthermore, the high-frequency signal passing through the filter 30 which is the third filter can be further demultiplexed, and thus three or more high-frequency signals having different frequency bands can be demultiplexed.

Furthermore, by providing the filter 40 which is the fourth filter, in each of the path passing through the filter 10 and the path passing through the filter 20A, an attenuation in a frequency band different from the HB and the MB is able to be improved.

Note that the hybrid multiplexer for demultiplexing three or more high-frequency signals may include the configuration of the first preferred embodiment or the second modification of the first preferred embodiment, instead of the configuration of the first modification of the first preferred embodiment. Furthermore, the hybrid multiplexer may further include other filters to demultiplex four or more high-frequency signals having different frequency bands from one another.

Figure 15:
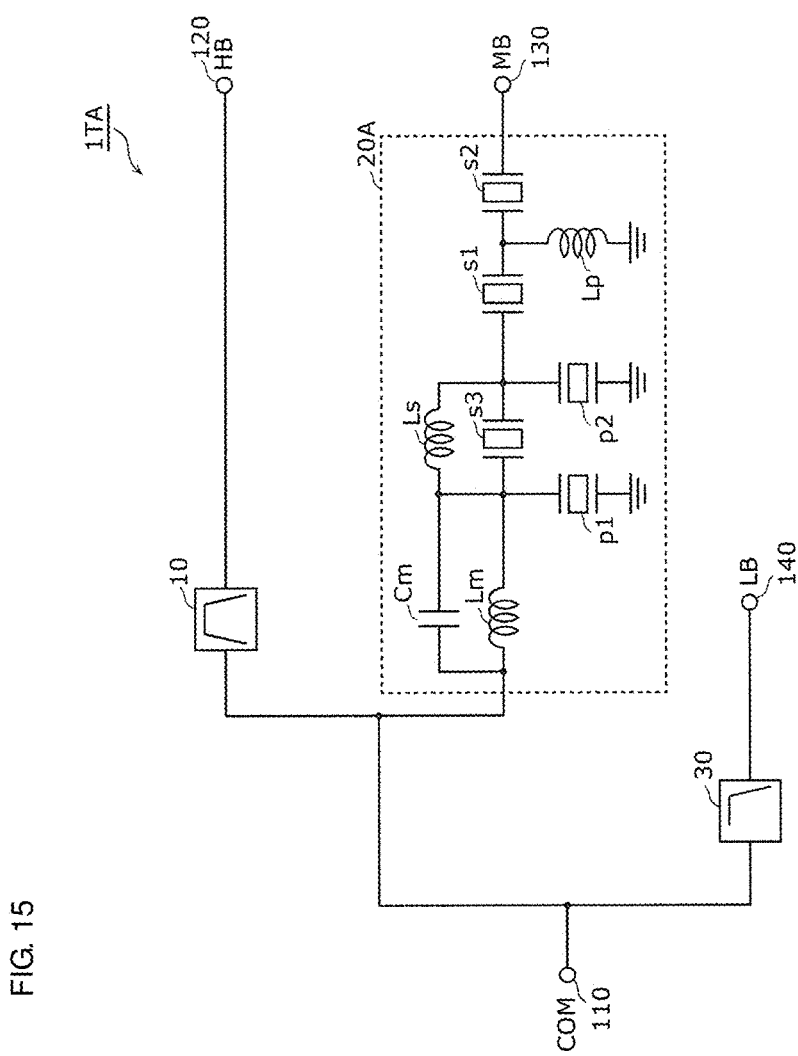
FIG. 15 is a circuit block diagram of another hybrid multiplexer according to the third modification of the first preferred embodiment of the present invention.

Furthermore, in the above description, although the triplexer is described using the configuration in which the filter connected to the common terminal 110 at a closer position thereto than the filter 10 and the filter 20A is provided as an example, the filter 40 may not be provided as in a hybrid multiplexer 1TA illustrated in FIG. 15.

FIG. 15 is a circuit block diagram of another hybrid multiplexer 1TA according to the third modification of the first preferred embodiment. In FIG. 15, for the filter 20A, the circuit configuration is also illustrated.

In the hybrid multiplexer 1TA configured as illustrated in FIG. 15 as well, by providing the filter 30 in the same or similar manner as the hybrid multiplexer 1T according to the above-described modification, three or more high-frequency signals having different frequency bands can be demultiplexed.

Second Preferred Embodiment

The hybrid multiplexer described above may preferably be used in, for example, a high-frequency module defining an LTE capable high-frequency front end circuit, for example. In the present preferred embodiment, such a high-frequency module will be described.

Figure 16:
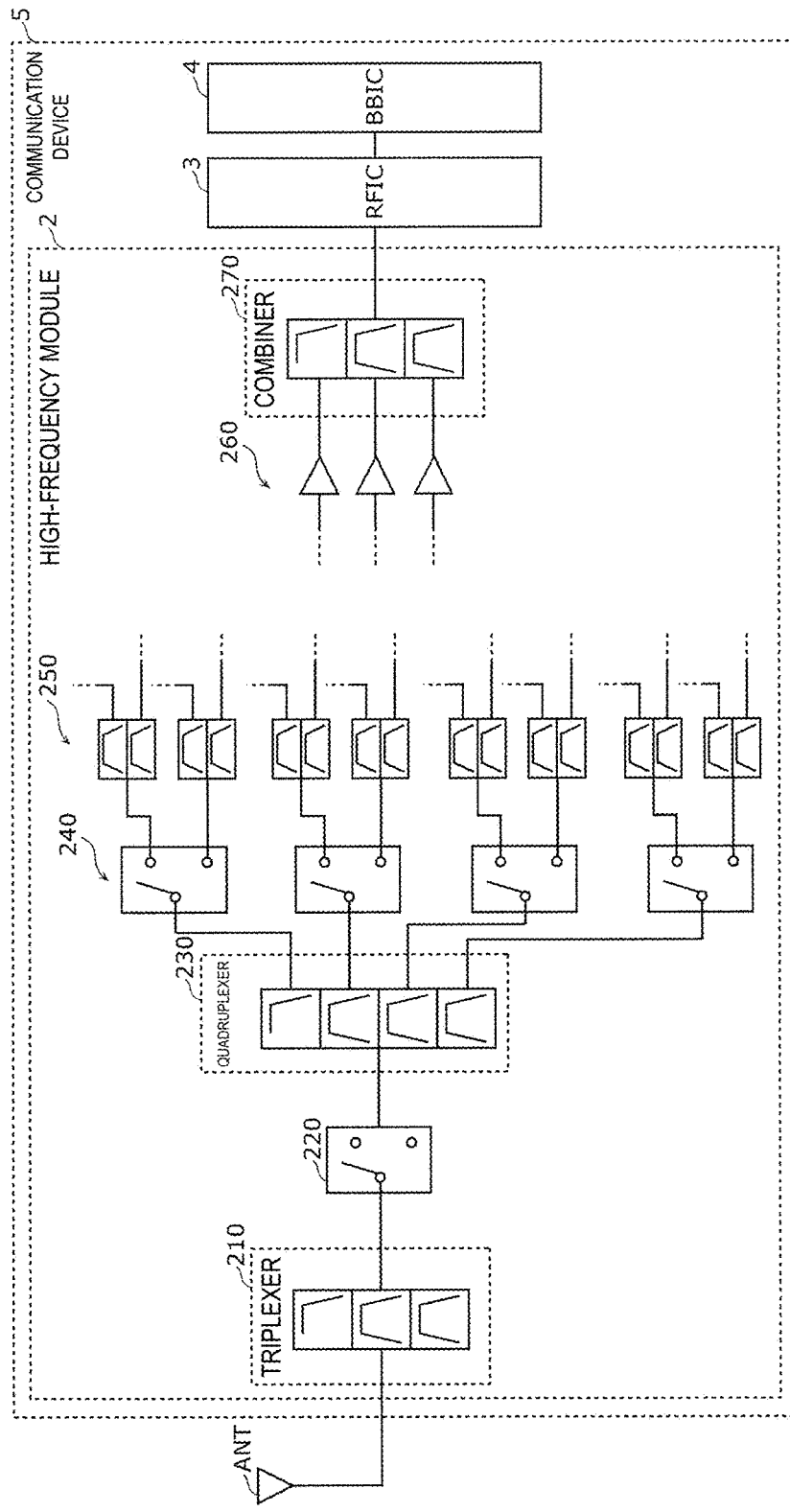
FIG. 16 is a circuit block diagram illustrating a configuration of a high-frequency module according to a second preferred embodiment of the present invention.

FIG. 16 is a circuit block diagram illustrating a configuration of a high-frequency module 2 according to a second preferred embodiment of the present invention. Note that FIG. 16 also illustrates a peripheral configuration connected to the high-frequency module 2. The peripheral configuration includes an antenna element ANT, an RFIC (Radio Frequency Integrated Circuit) 3 defining an RF signal processing circuit to process a high-frequency signal, and a BBIC (Baseband Integrated Circuit) 4 defining a baseband signal processing circuit. The high-frequency module 2, the RFIC 3, and the BBIC 4 define a communication device 5.

The high-frequency module 2 transmits, for example, a high-frequency signal having a Band (frequency band) compatible with LTE and defined by 3GPP (Third Generation Partnership Project). Specifically, the high-frequency module 2 is provided at a front end of the RFIC 3, and transmits a high-frequency signal to be processed by the RFIC 3 between the antenna element ANT and the RFIC 3.

The high-frequency module 2 illustrated in the diagram includes a triplexer 210, an initial stage switch 220, a quadruplexer 230, a plurality of posterior stage switches 240, a plurality of duplexers 250, a plurality of low noise amplifiers 260, and a combiner 270, in this order from the antenna element ANT side. Note that for simplicity, the diagram illustrates only one path among a plurality of paths connected to the triplexer 210, and illustration of the other paths is omitted. In addition, from the same viewpoint, illustration of the path of a transmission system connected to each of the plurality of duplexers 250 is also omitted. In addition, from the same viewpoint, illustration of the other paths is omitted as appropriate.

The triplexer 210 is a multiplexer including three filters each including one terminal commonly connected by a common terminal. The triplexer 210 demultiplexes a high-frequency signal input to the common terminal from the antenna element ANT and outputs the result to the initial stage switch 220, multiplexes a high-frequency signal input from the initial stage switch 220 and outputs the result to the antenna element ANT from the common terminal.

The initial stage switch 220 and the plurality of posterior stage switches 240 are switches for band selecting to switch the Band of the high-frequency signal transmitted by the high-frequency module 2 by switching a connection state in accordance with a control signal (not illustrated) from a control unit, such as the RFIC 3 or the like, for example.

The quadruplexer 230 is a multiplexer including four filters each including one terminal commonly connected by a common terminal. The quadruplexer 230 demultiplexes a high-frequency signal input to the common terminal from one filter among the three filters of the triplexer 210 through the initial stage switch 220 and outputs the result to the plurality of duplexers 250 through the plurality of posterior stage switches 240, multiplexes a high-frequency signal input from the plurality of duplexers 250 through the plurality of posterior stage switches 240 and outputs the result from the common terminal to the one filter of the triplexer 210 through the initial stage switch 220.

Each of the plurality of duplexers 250 is a multiplexer including a transmission filter and a reception filter each including one terminal commonly connected by a common terminal. Each of the duplexers outputs a high-frequency transmission signal input from a path (not illustrated) of the transmission system from a common terminal, outputs a high-frequency reception signal input to the common terminal to a path of a reception system.

Each of the plurality of low noise amplifiers 260 is an amplifier circuit connected to a multiplexer (here, the triplexer 210, the quadruplexer 230, or the combiner 270). Each of the low noise amplifiers amplifies the high-frequency signal demultiplexed by the multiplexer (here, the triplexer 210 or the quadruplexer 230).

The combiner 270 is a multiplexer including a plurality of filters each including one terminal commonly connected by a common terminal, and here, includes three filters. The combiner 270 multiplexes the high-frequency signals input from the plurality of low noise amplifiers 260, and outputs the result to, for example, the RFIC 3 from the common terminal.

In the high-frequency module 2 as described above, the hybrid multiplexer described in the first preferred embodiment and the modifications thereof may be used as at least one of the triplexer 210, the quadruplexer 230, and the combiner 270.

This makes it possible to achieve the high-frequency module 2 with low loss supporting a plurality of frequency bands.

Note that the hybrid multiplexer as described above is not limited to being used in the reception system of the high-frequency module 2, and may be used in the transmission system. Accordingly, the amplifier circuit connected to the hybrid multiplexer is not limited to the low noise amplifier, and may be a power amplifier.

Furthermore, the high-frequency module 2 as described above may support a method for simultaneously transmitting and receiving signals in a plurality of frequency bands. For this reason, the hybrid multiplexer used in the high-frequency module 2 may allow a high-frequency signal of one frequency band (for example, a Band 40 (about 2300 MHz-about 2400 MHz)) included in the first frequency band (for example, the HB) and a high-frequency signal of another frequency band (for example, a Band 66 (about 2110 MHz-about 2200 MHz)) included in the second frequency band (for example, the MB) to simultaneously pass therethrough. This makes it possible, for example, to support CA (carrier aggregation) in which communication is performed simultaneously using a plurality of Bands defined in LTE.

Although the multiplexers and the high-frequency front end circuits according to the preferred embodiments of the present invention have been described above using the preferred embodiments and modifications, the present invention also encompasses modifications obtained by adding various changes to the above-described preferred embodiments and modifications, which are conceived by those skilled in the art, without departing from the gist of the present invention, and various apparatuses such as the communication device or the like, for example, incorporating the high-frequency front end circuit according to preferred embodiments of the present invention. According to the communication device as described above, it is possible to achieve a communication device with low loss supporting a plurality of frequency bands.

Furthermore, for example, in the second filter of the hybrid multiplexer, an inductor or a capacitor may be further connected, or a circuit element, such as a resistance element or the like, for example, other than the inductor and the capacitor may be connected.

Furthermore, in the above description, the frequency band of the MB is described as about 1427 MHz-about 2200 MHz, but the frequency band of the MB may be about 1710 MHz-about 2200 MHz in some cases.

Furthermore, the matching circuit is not limited to being defined by the inductor, and may be defined by a capacitor. That is, the matching circuit may be defined by a capacitor provided in place of the inductor defining the matching circuit described above. Furthermore, the matching circuit is not limited to being defined by one element, may be defined by a plurality of elements, or may be defined by a combination of an inductor and a capacitor.

The present invention may be widely used for communication apparatuses such as a mobile phone or the like, for example, as a multiplexer used for a high-frequency front end circuit and a communication device, supporting a plurality of frequency bands with low loss.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
 a common terminal;
 a first filter connected to the common terminal and configured to allow passing of a first frequency band;
 a second filter connected to the common terminal and configured to allow passing of a second frequency band which does not overlap with the first frequency band; wherein
 the second filter includes:
  a matching circuit connected to the common terminal;
  a first resonance circuit cascade connected to the matching circuit and defining one of a low pass filter and a high pass filter; and
  a second resonance circuit cascade connected to the first resonance circuit and defining another of the low pass filter and the high pass filter;
 the low pass filter includes:
  a first inductor provided on a signal path connecting a first terminal and a second terminal of the second filter; and
  a first parallel arm resonator that is an acoustic wave resonator connected between a node on the signal path and a ground;
 the high pass filter includes:
  a first serial arm resonator that is an acoustic wave resonator provided on the signal path; and
  a second inductor connected between a node on the signal path and the ground; and
 a resonant frequency of the first parallel arm resonator and an anti-resonant frequency of the first serial arm resonator are both located between a frequency at a low-band end of the first frequency band and a frequency at a high-band end of the first frequency band.

2. The multiplexer according to claim 1, wherein
the frequency at the low-band end of the first frequency band is located at a higher-band side than a frequency at a high-band end of the second frequency band;
the matching circuit is defined by a matching inductor provided in series on the signal path;
the first resonance circuit is the low pass filter; and
the second resonance circuit is the high pass filter.

3. The multiplexer according to claim 2, wherein
a capacitor connected in parallel to the matching inductor is further included; and
a resonant frequency of a parallel circuit of the matching inductor and the capacitor is located in a frequency band obtained by multiplying the second frequency band by an integer equal to or more than two.

4. The multiplexer according to claim 1, wherein
the frequency at the high-band end of the first frequency band is located at a lower-band side than a frequency at a low-band end of the second frequency band;
the matching circuit is defined by a matching inductor connected between a node on the signal path and the ground;
the first resonance circuit is the high pass filter; and
the second resonance circuit is the low pass filter.

5. The multiplexer according to claim 1, wherein
a circuit in which the matching circuit and the first resonance circuit are cascade connected
exhibits low pass characteristics when the frequency at the low-band end of the first frequency band is located at the higher-band side than the frequency at the high-band end of the second frequency band; and
exhibits high pass characteristics when the frequency at the high-band end of the first frequency band is located at the lower-band side than the frequency at the low-band end of the second frequency band.

6. The multiplexer according to claim 1, wherein the resonant frequency of the first parallel arm resonator is located at a higher-band side than the anti-resonant frequency of the first serial arm resonator.

7. The multiplexer according to claim 1, wherein
the low pass filter further includes a bridging resonator which is an acoustic wave resonator bridge-connected to the first inductor; and
a sub-anti-resonant frequency which is different from an anti-resonant frequency of the bridging resonator in a circuit in which the first inductor and the bridging resonator are bridge-connected is located between the frequency at the low-band end of the first frequency band and the frequency at the high-band end of the first frequency band.

8. The multiplexer according to claim 7, wherein the sub-anti-resonant frequency is located between an anti-resonant frequency group of one or more serial arm resonators of the high pass filter and a resonant frequency group of one or more parallel arm resonators of the low pass filter.

9. The multiplexer according to claim 1, wherein
the low pass filter further includes a second parallel arm resonator which is an acoustic wave resonator connected between a node on the signal path and the ground;
the high pass filter further includes a second serial arm resonator which is an acoustic wave resonator provided on the signal path;
one of the first parallel arm resonator and the second parallel arm resonator is connected to the node on one terminal side of the first inductor and another one of the first parallel arm resonator and the second parallel arm resonator is connected to the node on another terminal side of the first inductor;
a resonant frequency of the second parallel arm resonator is located on a higher-band side than both the anti-resonant frequency of the first serial arm resonator and an anti-resonant frequency of the second serial arm resonator and on a lower-band side than the frequency at the high-band end of the first frequency band;
the first serial arm resonator and the second serial arm resonator are connected to each other with a node, to which the second inductor is connected, on the signal path interposed between the first serial arm resonator and the second serial arm resonator; and
the anti-resonant frequency of the second serial arm resonator is located on a higher-band side than the frequency at the low-band end of the first frequency band and on a lower-band side than both the resonant frequency of the first parallel arm resonator and the resonant frequency of the second parallel arm resonator.

10. The multiplexer according to claim 1, wherein the resonator of the low pass filter and the resonator of the high pass filter are provided as separate chips.

11. The multiplexer according to claim 1, further comprising:
a third filter which allows passing of a high-frequency signal of a third frequency band which does not overlap with the first frequency band and the second frequency band.

12. The multiplexer according to claim 1, further comprising:
a fourth filter which is connected to the common terminal at a closer position to the common terminal than the first filter and the second filter and allows passing of a high-frequency signal of a fourth frequency band which includes the first frequency band and the second frequency band.

13. The multiplexer according to claim 1, wherein simultaneously passing of a high-frequency signal of one frequency band included in the first frequency band and a high-frequency signal of another frequency band included in the second frequency band are allowed.

14. A high-frequency front end circuit comprising:
the multiplexer according to claim 1; and
an amplifier circuit connected to the multiplexer.

15. The high-frequency front end circuit according to claim 14, wherein
the multiplexer demultiplexes a high-frequency signal input to the common terminal; and
the amplifier circuit is a low noise amplifier configured to amplify the high-frequency signal demultiplexed by the multiplexer.

16. The high-frequency front end circuit according to claim 14, wherein
the amplifier circuit is a low noise amplifier; and
the multiplexer is a combiner that multiplexes the high-frequency signal amplified by the amplifier circuit and outputs from the common terminal.

17. A high-frequency front end circuit comprising:
the multiplexer according to claim 1;
a switch connected to a terminal on an opposite side from the common terminal of the first filter or the second filter; and
a duplexer connected to the first filter or the second filter with the switch interposed between the duplexer and the first filter or the second filter.

18. A communication device comprising:
an RF signal processing circuit configured to process a high-frequency signal; and
the high-frequency front end circuit according to claim 14 configured to transmit the high-frequency signal to be processed by the RF signal processing circuit between an antenna element and the RF signal processing circuit.

* * * * *